United States Patent
Vinish

(10) Patent No.: US 12,422,678 B2
(45) Date of Patent: Sep. 23, 2025

(54) MULTILAYER FLAT LENS FOR ULTRA-HIGH RESOLUTION PHASE DELAY AND WAVEFRONT RESHAPING

(71) Applicant: Meta Platforms Technologies, LLC, Menlo Park, CA (US)

(72) Inventor: Yaniv Vinish, Carrigtwohill (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 614 days.

(21) Appl. No.: 17/681,228

(22) Filed: Feb. 25, 2022

(65) Prior Publication Data

US 2023/0273434 A1 Aug. 31, 2023

(51) Int. Cl.
*G02B 27/01* (2006.01)
*H01L 25/16* (2023.01)
*H10H 29/14* (2025.01)

(52) U.S. Cl.
CPC ........ *G02B 27/0172* (2013.01); *H01L 25/167* (2013.01); *H10H 29/142* (2025.01); *G02B 2027/0178* (2013.01)

(58) Field of Classification Search
CPC ........ G02B 27/0172; G02B 2027/0178; H01L 25/167; H01L 27/156
USPC ........................................................ 359/359
See application file for complete search history.

(56) References Cited

U.S. PATENT DOCUMENTS

| | | |
|---|---|---|
| 11,579,456 B2 | 2/2023 | Riley, Jr. et al. |
| 2015/0219806 A1 | 8/2015 | Arbabi et al. |
| 2017/0310907 A1 | 10/2017 | Wang |
| 2018/0052501 A1 | 2/2018 | Jones, Jr. et al. |
| 2018/0252857 A1 | 9/2018 | Glik et al. |
| 2018/0348548 A1* | 12/2018 | Visser ................ H10K 59/353 |
| 2020/0174163 A1* | 6/2020 | Han ...................... G02B 1/002 |
| 2021/0088694 A1* | 3/2021 | Lee ........................ C01G 15/00 |
| 2021/0132255 A1* | 5/2021 | Barton, III ............ G02B 1/002 |

(Continued)

FOREIGN PATENT DOCUMENTS

| | | |
|---|---|---|
| WO | WO-2018222688 A1 | 12/2018 |
| WO | WO-2020065380 A1 | 4/2020 |
| WO | WO-2023055894 A1 | 4/2023 |

OTHER PUBLICATIONS

Dou K., et al., "Off-Axis Multi-Wavelength Dispersion Controlling Metalens for Multi-Color Imaging," Opto-Electronic Advances, Apr. 20, 2020, vol. 03, No. 04, 7 pages.

(Continued)

*Primary Examiner* — Sharrief I Broome
(74) *Attorney, Agent, or Firm* — Greenberg Traurig, LLP

(57) ABSTRACT

A flat optical device includes a substrate, a first nanostructure layer on the substrate, and a second nanostructure layer on the first nanostructure layer. The first nanostructure layer includes a first array of meta-elements in a first array of segments and characterized by a same first height in a first direction. The second nanostructure layer includes a second array of meta-elements in a second array of segments and characterized by a same second height in the first direction. The second array of segments is shifted with respect to the first array of segments in one or more directions perpendicular to the first direction. In one example, the flat optice device includes an array of flat micro-lenses and is configured to collimate and/or deflect light beams emitted by an array of micro-light emitting diodes.

19 Claims, 15 Drawing Sheets

(56) References Cited

U.S. PATENT DOCUMENTS

2021/0159373 A1* 5/2021 Grundmann ............ H01L 33/24
2023/0101633 A1   3/2023 Shi et al.
2023/0170446 A1* 6/2023 Mezouari ............ H01L 33/502
                                                    257/79

OTHER PUBLICATIONS

International Search Report and Written Opinion for International Application No. PCT/US2022/045176, mailed Feb. 10, 2023, 8 pages.
Khorasaninejad M., et al., "Achromatic Metalens over 60 nm Bandwidth in the Visible and Metalens with Reverse Chromatic Dispersion," Nano Letters, Jan. 26, 2017, vol. 17, No. 03, pp. 1819-1824.
Khorasaninejad M., et al., "Supporting Information: Achromatic Metalens over 60 nm Bandwidth in the Visible and Metalens with Reverse Chromatic Dispersion," Nano Letters, 2017, 7 pages.
Liu Z., et al., "Generative Model for the Inverse Design of Metasurfaces," Nano Letters, Sep. 12, 2018, vol. 18, No. 10, pp. 6570-6576.
Liu Z., et al., "Tackling Photonic Inverse Design with Machine Learning," Advanced Science, Jan. 7, 2021, vol. 08, No. 05, 15 pages.
Shi Z., et al., "Single-Layer Metasurface with Controllable Multiwavelength Functions," Nano Letters, Feb. 20, 2018, vol. 18, No. 04, pp. 2420-2427.
Zhang Y., et al., "Multi-round Surrogate-based Optimization for Benchmark Aerodynamic Design Problems," 54th AIAA Aerospace Sciences Meeting, Jan. 4, 2016, 17 pages.
International Search Report and Written Opinion for International Application No. PCT/US2023/013433, mailed Jun. 13, 2023, 12 pages.
International Preliminary Report on Patentability for International Application No. PCT/US2023/013433, mailed Sep. 6, 2024, 10 pages.

\* cited by examiner

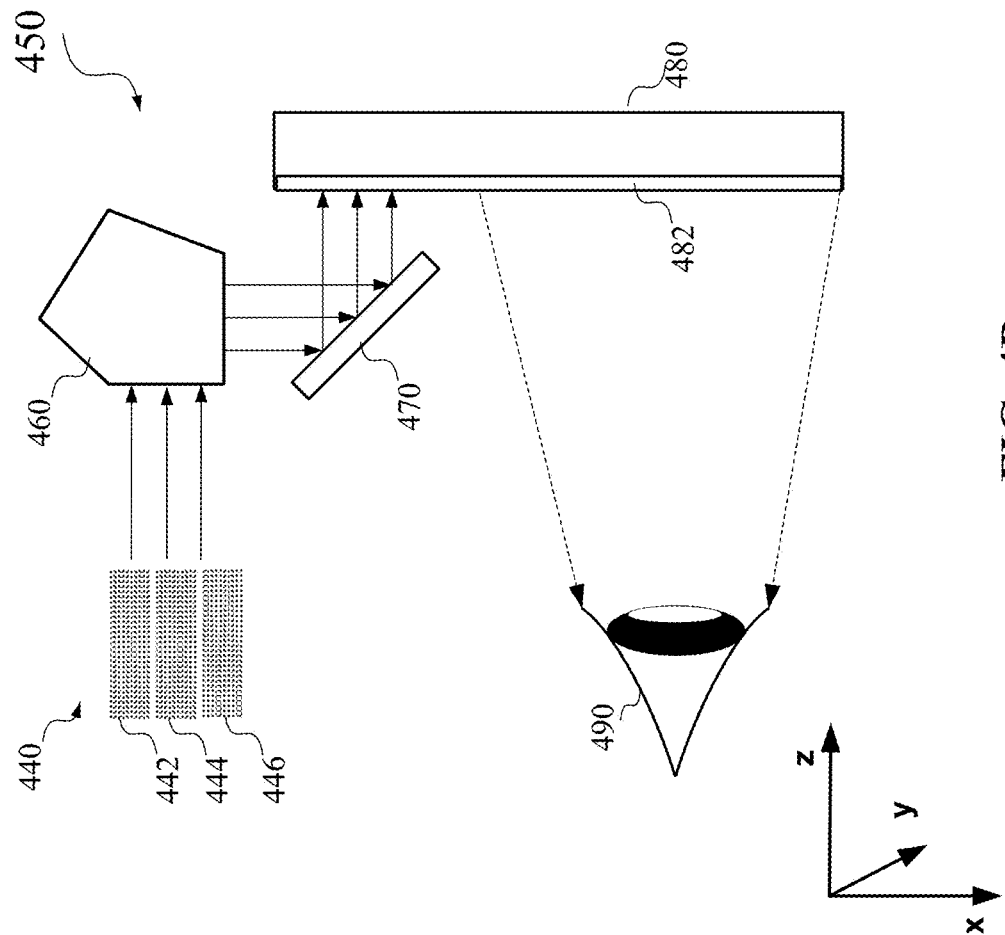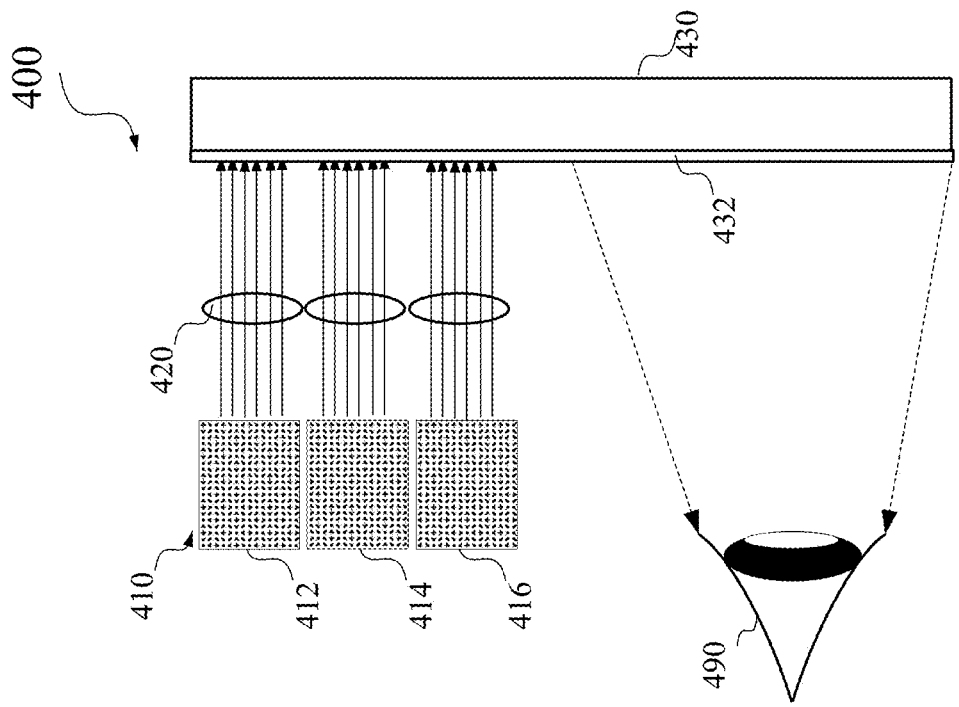
FIG. 4B
FIG. 4A

MULTILAYER FLAT LENS FOR ULTRA-HIGH RESOLUTION PHASE DELAY AND WAVEFRONT RESHAPING

BACKGROUND

An artificial reality system, such as a head-mounted display (HMD) or heads-up display (HUD) system, generally includes a near-eye display system in the form of a headset or a pair of glasses and is configured to present content to a user via an electronic or optic display within, for example, about 10-20 mm in front of the user's eyes. The near-eye display system may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). The display system generally includes one or more light sources that are driven to output light at various luminance levels.

SUMMARY

This disclosure relates generally to flat optical devices such as metasurfaces. More specifically, techniques disclosed herein relate to flat optical devices including multiple flat nanostructure layers with relatively shifted meta-element lattices and thus having reduced effective lattice periods and improved discretization resolution and diffraction efficiency. Various inventive embodiments are described herein, including devices, systems, methods, processes, materials, and the like.

According to certain embodiments, a flat lens may include a substrate, a first nanostructure layer on the substrate, and a second nanostructure layer on the first nanostructure layer. The first nanostructure layer includes a first array of meta-elements in a first array of segments and characterized by a same first height in a first direction (e.g., z direction). The second nanostructure layer includes a second array of meta-elements in a second array of segments and characterized by a same second height in the first direction. The second array of segments is shifted with respect to the first array of segments in one or more directions (e.g., two different directions) perpendicular to the first direction (e.g., in x direction and/or y direction). An offset between the first array of segments and the second array of segments in a second direction perpendicular to the first direction may be equal to or less than a half (e.g, a half, a third, or a quarter) of a pitch of the first array of segments in the second direction.

In some embodiments of the flat optical device, a meta-element of the second array of meta-elements may overlap with at least a portion of each meta-element of two adjacent meta-elements of the first array of meta-elements in at least one direction (e.g., x direction and/or y direction) perpendicular to the first direction. In some embodiments, the first array of segments may include a two-dimensional array of rectangles or a two-dimensional array of hexagons. In some embodiments, a pitch of the first array of segments is equal to or greater than about 400 nm, and a pitch of the second array of segments is equal to or greater than about 400 nm. The second height may be the same as or different from the first height. In some embodiments, the first nanostructure layer may include a dielectric material between the first array of meta-elements, the dielectric material having a refractive index lower than a refractive index of the first array of meta-elements. The first array of meta-elements and the second array of meta-elements may include, for example, $TiO_2$, $ZrO_2$, $HfO_2$, $Ta_2O_5$, $WO_3$, $Nb_2O_5$, GaN, $Si_3N_4$, TiN, ZrN, HfN, or a combination. In some embodiments, the first array of meta-elements and the second array of meta-elements may be characterized by a refractive index greater than about 1.75, greater than about 2.0, or greater than about 2.5.

In some embodiments, the flat optical device may also include a third nanostructure layer on the second nanostructure layer. The third nanostructure layer may include a third array of meta-elements in a third array of segments. Each meta-element of the third array of meta-elements may be characterized by a third height in the first direction. The third array of segments may be shifted with respect to the first array of segments and the second array of segments in one or more directions perpendicular to the first direction. The third height may be the same as or different from the first height and the second height. In some embodiments, the flat optical device may include more than three nanostructure layers. In some embodiments, the flat optical device may include N nanostructure layers, where a minimum shift between the N nanostructure layers is 1/N of the pitch of the first array of segments.

According to certain embodiments, a light source may include an array of micro-light emitting diodes (micro-LEDs), and an array of flat micro-lenses on the array of micro-LEDs. The array of flat micro-lenses includes a first flat nanostructure layer including a first array of meta-elements in a first array of segments, and a second flat nanostructure layer on the first flat nanostructure layer and including a second array of meta-elements in a second array of segments. The second array of segments may be shifted with respect to the first array of segments in one or more (e.g., two) directions perpendicular to a thickness direction of the first flat nanostructure layer. The thickness of the second flat nanostructure layer may be the same as or different from the thickness of the first flat nanostructure layer.

In some embodiments, a meta-element of the second array of meta-elements may overlap with at least a portion of each meta-element of two adjacent meta-elements of the first array of meta-elements in at least one direction perpendicular to the thickness direction of the first flat nanostructure layer. In some embodiments, a pitch of the array of micro-LEDs may be equal to or less than about 10 µm (e.g., about 3 µm or about 2 µm), a pitch of the first array of segments is equal to or greater than about 400 nm, and a pitch of the second array of segments is equal to or greater than about 400 nm. A pitch of the array of flat micro-lenses may be the same as or different from a pitch of the array of micro-LEDs. An offset between the first array of segments and the second array of segments in a first direction perpendicular to the thickness direction of the first flat nanostructure layer may be equal to or less than a half (e.g., a half, a third, or a quarter) of a pitch of the first array of segments in the first direction. The first array of meta-elements and the second array of meta-elements may be characterized by a refractive index greater than about 1.75, greater than about 2.0, or greater than about 2.5.

In some embodiments, the array of flat micro-lenses may also include a third flat nanostructure layer on the second flat nanostructure layer. The third flat nanostructure layer may include a third array of meta-elements in a third array of segments. The third array of segments may be shifted with respect to the first array of segments and the second array of segments in one or more directions perpendicular to the thickness direction of the first flat nanostructure layer. In some embodiments, the array of flat micro-lenses may include more than three flat nanostructure layers.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4A illustrates an example of a near-eye display device including a waveguide display according to certain embodiments.

FIG. 4B illustrates an example of a near-eye display device including a waveguide display according to certain embodiments.

Figure 1:
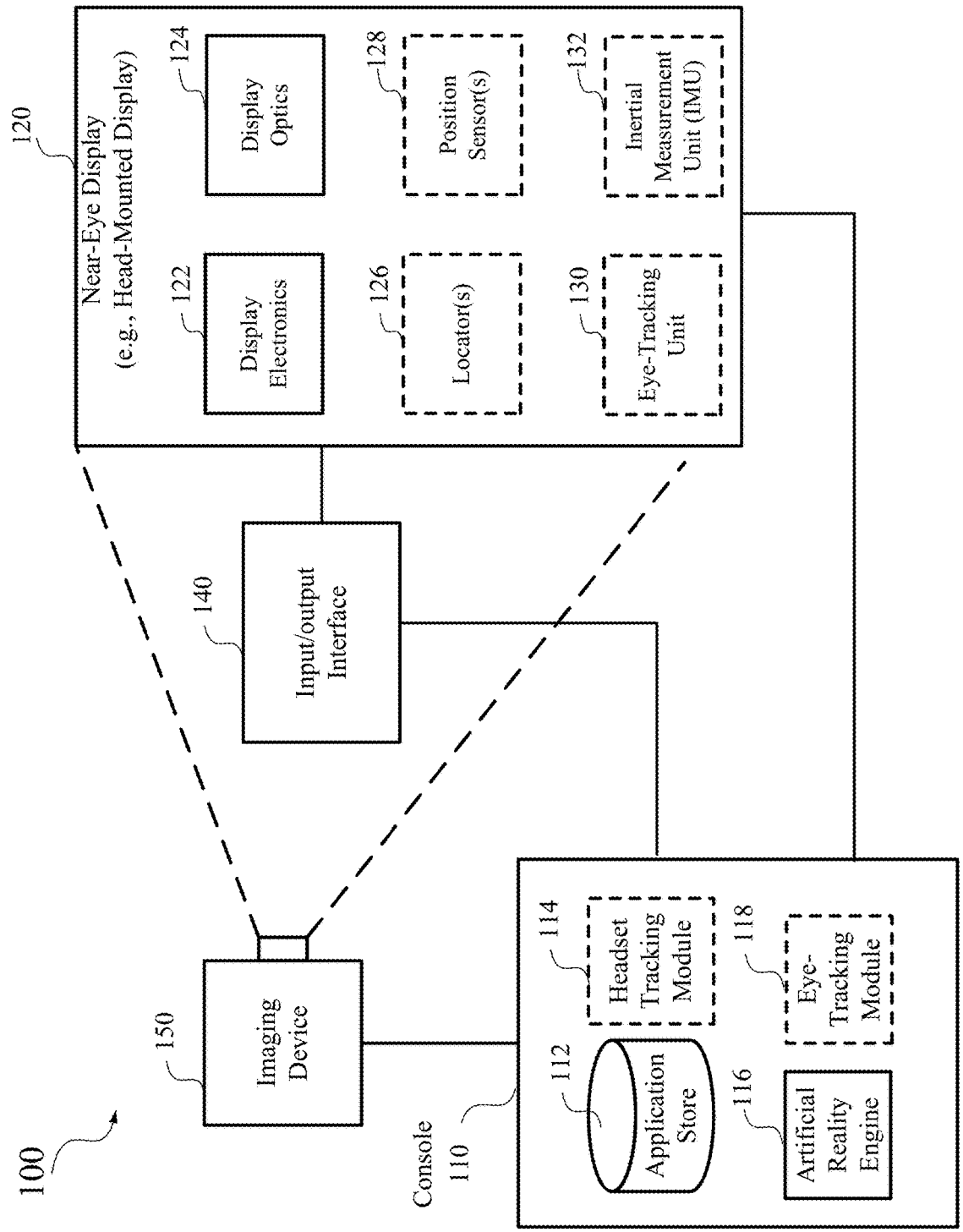
FIG. 1 is a simplified block diagram of an example of an artificial reality system environment including a near-eye display according to certain embodiments.

The figures depict embodiments of the present disclosure for purposes of illustration only. Some figures may not be drawn to scale. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to flat optical devices such as metasurfaces. More specifically, techniques disclosed herein relate to flat optical devices including multiple flat nanostructure layers with relatively shifted meta-element lattices and thus having reduced effective lattice periods and improved discretization resolution and diffraction efficiency. Various inventive embodiments are described herein, including devices, systems, methods, processes, materials, and the like.

In some near-eye display systems, light emitted from an array of light sources (e.g., light-emitting diodes (LEDs)) may be collimated and coupled into a display (e.g., a waveguide display) for displaying images to a user's eyes. The overall efficiency $\eta_{tot}$ of a waveguide display system for artificial reality applications may be determined by $\eta_{tot}=\eta_{EQE}\times\eta_{in}\times\eta_{out}$, where $\eta_{EQE}$ is the external quantum efficiency (EQE) of each light source and may be proportional to the carrier (e.g., electron) injection efficiency, the internal quantum efficiency, and the light extraction efficiency (LEE); $\eta_{in}$ is the in-coupling efficiency of display light from the light sources into the waveguide; and $\eta_{out}$ is the out-coupling efficiency of the display light from the waveguide towards the user's eye. Only a fraction of the light emitted by an LED within a certain solid angle may be extracted from the LED and coupled into the waveguide, and eventually reach the user's eyes, due to the total internal reflection at the light emitting surface of the LED, and the limited field of view and/or exit pupil (or eyebox) size of the display system.

Many light emitting devices, such as micro-LEDs, organic LEDs (OLEDs), quantum dot LEDs (QLEDs), Quantum Dot Electro Luminescent (QDEL) devices, and Perovskite LEDs (PeLEDs), may have an angular emission profile close to Lambertian. This may reduce the coupling efficiency from the light sources to the eyebox because some emitted light having large emission angles may not be directed to the eyebox, and may cause ghost images due to, for example, stray light from the large emission angles. To improve the efficiency and performance of a display system, the display panel of the display system may be designed such that the emission angle of each light source is more directional. For example, an array of micro-lenses may be used to collimate light beams emitted by an array of light sources of the display panel. However, a large portion of the light emitted from light sources near edges of the array of light sources may not be collected and delivered to the eyebox of the display system. In some near-eye display systems, light emitted from light sources near the edges of the array of light sources may be redirected (e.g., deflected) towards the display optics such that the emitted light may be collected and delivered to the eyebox of the display system. One technique to redirect the light emitted from some light sources is to use beam-deflecting micro-optical elements, such as decentered micro-lenses, micro-prisms, or gratings. However, these beam-collimating and/or beam-deflecting micro-optical elements may have curved surfaces that are difficult to fabricate using conventional fabrication techniques, and may have limited efficiency and/or deflection angle due to certain geometry limitations.

According to certain embodiments, flat optical devices, such as flat lenses implemented using metasurfaces, may be used to extract, collimate, and/or redirect light emitted by light sources to user's eyes. The flat optical devices may each include multiple flat layers of nanostructures (e.g., subwavelength structures referred to as meta-elements or nano-antennas), where each flat layer of nanostructures may generate a portion of the total phase delay at a given area (referred to as a segment or a cell) of the flat optical device to approximate the ideal phase delay profile of an optical device, such as a lens. Each flat layer of nanostructures may include an array of meta-elements positioned in an array of segments that are arranged according to a lattice (also referred to as a mesh or a grid). The meta-elements may have desired shapes, sizes, and orientations to provide desired phase delays at the array of segments. The minimum period of the lattice in each flat layer of nanostructures may limit the diffraction efficiency of the flat layer of nanostructures, and may in turn be limited by the fabrication processes, such as the diffraction limits of the photolithography techniques used to pattern the nanostructures.

To achieve a higher manufacturing yield, the lattice in each flat layer of nanostructures may have a relatively large pitch, and thus each flat layer of the flat optical device may be relatively easy to fabricate using existing photo-lithography techniques. To improve the efficiency of the flat optical device, the lattice of each flat layer of the multiple flat layers of the flat optical device may be shifted with respect to the lattices of other flat layers, such that the effective pitch (and the effective size of each resultant segment) of the flat optical device may be reduced and the resolution of the discretization of the ideal phase delay profile may be improved. For example, if the flat optical device includes two layers of nanostructures and the segments of the second layer are shifted with respect to the first layer by a half of the pitch p of the segments in each layer in each direction (e.g., x or y direction), the effective pitch of the segments of the flat optical device may be reduced to p/2 in each direction, and the effective size of each resultant segment of the two-layer flat optical device may be reduced to a quarter of the size of each segment in a single layer. As such, the efficiency of the flat optical device can be improved significantly.

The flat optical devices may have any arbitrary phase delay profiles and thus may arbitrarily modify the wavefront of an incident light beam to achieve any desired function or combination of functions. For example, multiple functions (e.g., collimation and deflection functions) may be implemented by a flat optical device through different designs of individual meta-elements and/or different arrangements of the meta-elements. The metasurfaces can also be designed to have the same or similar performance for red, green, and blue wavelength bands and thus may be achromatic. The flat optical devices (e.g., metasurfaces) can have sub-micron thicknesses and thus may allow for a large range of incidence angles (without minimum or no potential clipping or edge effect). The flat optical devices disclosed herein may be manufactured using standard nanofabrication processes that are compatible with complementary metal-oxide-semiconductor (CMOS), n-type metal-oxide-semiconductor (NMOS), p-type metal-oxide-semiconductor (PMOS), thin-film transistor (TFT), or other display-related fabrication processes.

The flat optical devices described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "flat optical device," "planar optical device," "metasurface," or "meta-structure" may refer to an optical device having a uniform thickness (e.g., a subwavelength thickness) and including subwavelength structures configured to generate relative phase delays between 0 and 2π. Each subwavelength structure may be referred to as a "meta-element," "meta-atom," "nano-antenna," or "phase shifter." The flat optical device may be divided into an array of "segments" or "cells" that are arranged according to a "lattice," "mesh," or "grid." The subwavelength structures may be positioned in the array of segments, and may have desired shapes, sizes, and/or orientations to achieve desired phase delays at the array of segments for incident light of a certain wavelength and/or a certain polarization state.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2A:
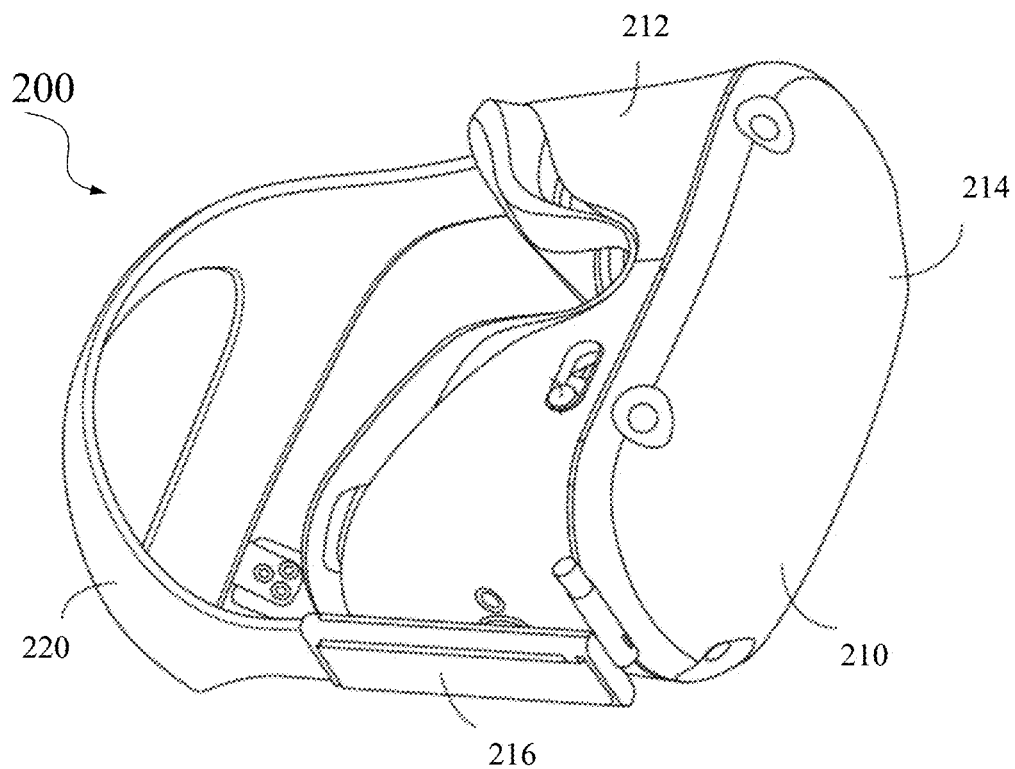
FIG. 2A is a perspective view of an example of a near-eye display in the form of a head-mounted display (HMD) device for implementing some of the examples disclosed herein.

FIG. 2A is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 210 and a head strap 220. FIG. 2A shows a bottom side 212, a front side 214, and a left side 216 of body 210 in the perspective view. Head strap 220 may have an adjustable or extendible length. There may be a sufficient space between body 210 and head strap 220 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 2B below, rather than head strap 220.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2A) enclosed in body 210 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 210 relative to one another and relative to a reference point. Each of the locators may emit light that is detectable by an external imaging device.

Figure 2B:
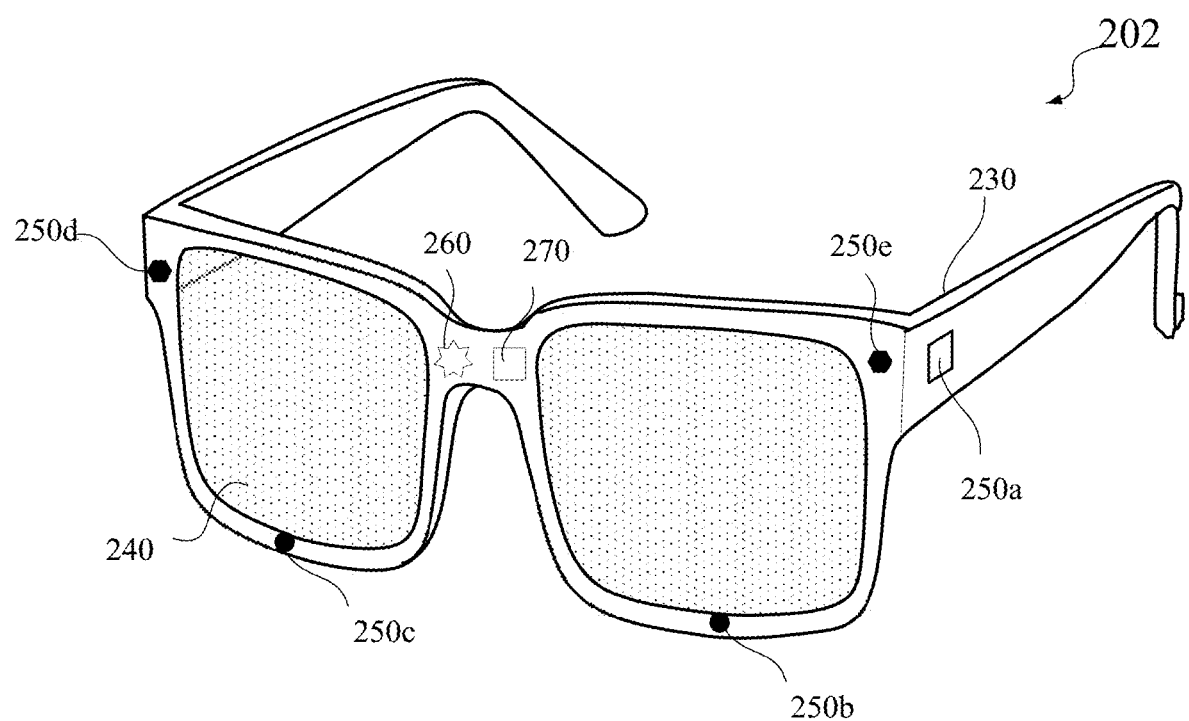
FIG. 2B is a perspective view of an example of a near-eye display in the form of a pair of glasses for implementing some of the examples disclosed herein.

FIG. 2B is a perspective view of an example of a near-eye display 202 in the form of a pair of glasses for implementing some of the examples disclosed herein. Near-eye display 202 may be a specific implementation of near-eye display 120 of FIG. 1, and may be configured to operate as a virtual reality display, an augmented reality display, and/or a mixed reality display. Near-eye display 202 may include a frame 230 and a display 240. Display 240 may be configured to present content to a user. In some embodiments, display 240 may include display electronics and/or display optics. For example, as described above with respect to near-eye display 120 of FIG. 1, display 240 may include an LCD display panel, an LED display panel, or an optical display panel (e.g., a waveguide display assembly). In some embodiments, display 240 may allow ambient light to pass through.

Near-eye display 202 may further include various sensors 250a, 250b, 250c, 250d, and 250e on or within frame 230. In some embodiments, sensors 250a-250e may include one or more depth sensors, motion sensors, position sensors, inertial sensors, or ambient light sensors. In some embodiments, sensors 250a-250e may include one or more image sensors configured to generate image data representing different fields of views in different directions. In some embodiments, sensors 250a-250e may be used as input devices to control or influence the displayed content of near-eye display 202, and/or to provide an interactive VR/AR/MR experience to a user of near-eye display 202. In some embodiments, sensors 250a-250e may also be used for stereoscopic imaging.

In some embodiments, near-eye display 202 may further include one or more illuminators 260 to project light into the physical environment. The projected light may be associated with different frequency bands (e.g., visible light, infra-red light, ultra-violet light, etc.), and may serve various purposes. For example, illuminator(s) 260 may project light in a dark environment (or in an environment with low intensity of infra-red light, ultra-violet light, etc.) to assist sensors 250a-250e in capturing images of different objects within the dark environment. In some embodiments, illuminator(s) 260 may be used to project certain light patterns onto the objects within the environment. In some embodiments, illuminator(s) 260 may be used as locators, such as locators 126 described above with respect to FIG. 1.

In some embodiments, near-eye display 202 may also include a high-resolution camera 270. Camera 270 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 240 for AR or MR applications.

Figure 3:
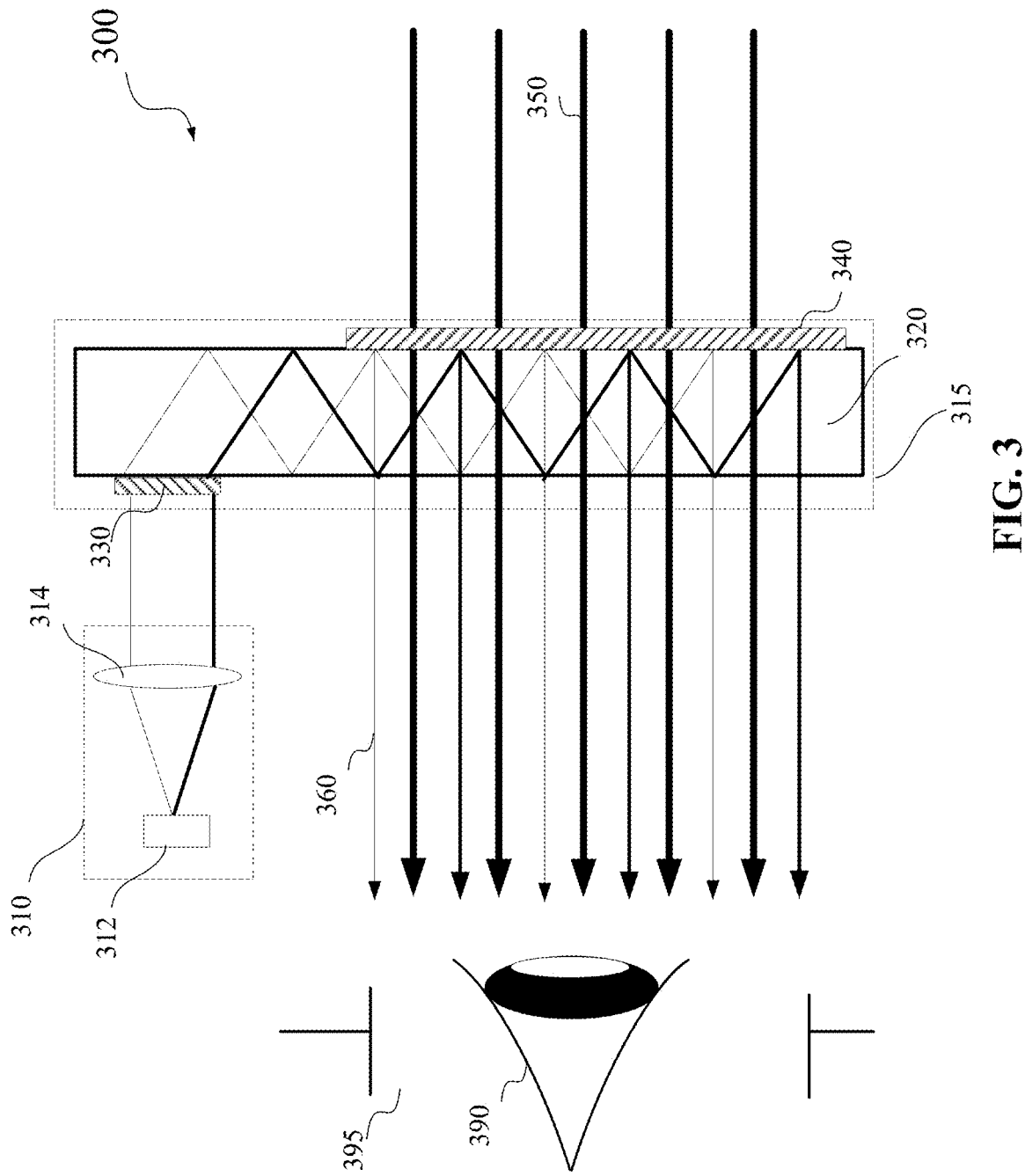
FIG. 3 illustrates an example of an optical see-through augmented reality system including a waveguide display according to certain embodiments.

FIG. 3 illustrates an example of an optical see-through augmented reality system 300 including a waveguide display according to certain embodiments. Augmented reality system 300 may include a projector 310 and a combiner 315. Projector 310 may include a light source or image source 312 and projector optics 314. In some embodiments, light source or image source 312 may include one or more micro-LED devices described above. In some embodiments, image source 312 may include a plurality of pixels that displays virtual objects, such as an LCD display panel or an LED display panel. In some embodiments, image source 312 may include a light source that generates coherent or partially coherent light. For example, image source 312 may include a laser diode, a vertical cavity surface emitting laser, an LED, and/or a micro-LED described above. In some embodiments, image source 312 may include a plurality of light sources (e.g., an array of micro-LEDs described above), each emitting a monochromatic image light corresponding to a primary color (e.g., red, green, or blue). In some embodiments, image source 312 may include three two-dimensional arrays of micro-LEDs, where each two-dimensional array of micro-LEDs may include micro-LEDs configured to emit light of a primary color (e.g., red, green, or blue). In some embodiments, image source 312 may include an optical pattern generator, such as a spatial light modulator. Projector optics 314 may include one or more optical components that can condition the light from image source 312, such as expanding, collimating, scanning, or projecting light from image source 312 to combiner 315. The one or more optical components may include, for example, one or more lenses, liquid lenses, mirrors, apertures, and/or gratings. For example, in some embodiments, image source 312 may include one or more one-dimensional arrays or elongated two-dimensional arrays of micro-LEDs, and projector optics 314 may include one or more one-dimensional scanners (e.g., micro-mirrors or prisms) configured to scan the one-dimensional arrays or elongated two-dimensional arrays of micro-LEDs to generate image frames. In some embodiments, projector optics 314 may include a liquid lens (e.g., a liquid crystal lens) with a plurality of electrodes that allows scanning of the light from image source 312.

Combiner 315 may be an example of display 240 and may include an input coupler 330 for coupling light from projector 310 into a substrate 320 of combiner 315. Combiner 315 may transmit at least 50% of light in a first wavelength range and reflect at least 25% of light in a second wavelength range. For example, the first wavelength range may be visible light from about 300 nm to about 650 nm, and the second wavelength range may be in the infrared band, for example, from about 800 nm to about 1000 nm. Input coupler 330 may include a volume holographic grating, a diffractive optical element (DOE) (e.g., a surface-relief grating), a slanted surface of substrate 320, or a refractive coupler (e.g., a wedge or a prism). For example, input coupler 330 may include a reflective volume Bragg grating or a transmissive volume Bragg grating. Input coupler 330 may have a coupling efficiency of greater than 30%, 50%, 75%, 90%, or higher for visible light. Light coupled into substrate 320 may propagate within substrate 320 through, for example, total internal reflection (TIR). Substrate 320 may be in the form of a lens of a pair of eyeglasses. Substrate 320 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 320 may be transparent to visible light.

Substrate 320 may include or may be coupled to a plurality of output couplers 340, each configured to extract at least a portion of the light guided by and propagating within substrate 320 from substrate 320, and direct extracted light 360 to an eyebox 395 where an eye 390 of the user of augmented reality system 300 may be located when augmented reality system 300 is in use. The plurality of output couplers 340 may replicate the exit pupil to increase the size of eyebox 395 such that the displayed image is visible in a larger area. As input coupler 330, output couplers 340 may include grating couplers (e.g., volume holographic gratings or surface-relief gratings), other DOEs, prisms, etc. For example, output couplers 340 may include reflective volume Bragg gratings or transmissive volume Bragg gratings. Output couplers 340 may have different coupling (e.g., diffraction) efficiencies at different locations. Substrate 320 may also allow light 350 from the environment in front of combiner 315 to pass through with little or no loss. Output couplers 340 may also allow light 350 to pass through with little loss. For example, in some implementations, output couplers 340 may have a very low diffraction efficiency for light 350 such that light 350 may be refracted or otherwise pass through output couplers 340 with little loss, and thus may have a higher intensity than extracted light 360. In some implementations, output couplers 340 may have a high diffraction efficiency for light 350 and may diffract light 350 in certain desired directions (i.e., diffraction angles) with little loss. As a result, the user may be able to view combined images of the environment in front of combiner 315 and images of virtual objects projected by projector 310.

FIG. 4A illustrates an example of a near-eye display (NED) device 400 including a waveguide display 430 according to certain embodiments. NED device 400 may be an example of near-eye display 120, augmented reality system 300, or another type of display device. NED device 400 may include a light source 410, projection optics 420, and waveguide display 430. Light source 410 may include multiple panels of light emitters for different colors, such as a panel of red light emitters 412, a panel of green light emitters 414, and a panel of blue light emitters 416. The red light emitters 412 are organized into an array; the green light emitters 414 are organized into an array; and the blue light emitters 416 are organized into an array. The dimensions and pitches of light emitters in light source 410 may be small. For example, each light emitter may have a diameter less than 2 μm (e.g., about 1.2 μm) and the pitch may be less than 2 μm (e.g., about 1.5 μm). As such, the number of light emitters in each red light emitters 412, green light emitters 414, and blue light emitters 416 can be equal to or greater than the number of pixels in a display image, such as 960×720, 1280×720, 1440×1080, 1920×1080, 2160×1080, or 2560×1080 pixels. Thus, a display image may be generated simultaneously by light source 410. A scanning element may not be used in NED device 400.

Before reaching waveguide display 430, the light emitted by light source 410 may be conditioned by projection optics 420, which may include a lens array. Projection optics 420 may collimate or focus the light emitted by light source 410 to waveguide display 430, which may include a coupler 432 for coupling the light emitted by light source 410 into waveguide display 430. The light coupled into waveguide display 430 may propagate within waveguide display 430 through, for example, total internal reflection as described above with respect to FIG. 4. Coupler 432 may also couple portions of the light propagating within waveguide display 430 out of waveguide display 430 and towards user's eye 490.

FIG. 4B illustrates an example of a near-eye display (NED) device 450 including a waveguide display 480 according to certain embodiments. In some embodiments, NED device 450 may use a scanning mirror 470 to project light from a light source 440 to an image field where a user's eye 490 may be located. NED device 450 may be an example of near-eye display 120, augmented reality system 300, or another type of display device. Light source 440 may include one or more rows or one or more columns of light emitters of different colors, such as multiple rows of red light emitters 442, multiple rows of green light emitters 444, and multiple rows of blue light emitters 446. For example, red light emitters 442, green light emitters 444, and blue light emitters 446 may each include N rows, each row including, for example, 2560 light emitters (pixels). The red light emitters 442 are organized into an array; the green light emitters 444 are organized into an array; and the blue light emitters 446 are organized into an array. In some embodiments, light source 440 may include a single line of light emitters for each color. In some embodiments, light source 440 may include multiple columns of light emitters for each of red, green, and blue colors, where each column may include, for example, 1080 light emitters. In some embodiments, the dimensions and/or pitches of the light emitters in light source 440 may be relatively large (e.g., about 3-4 μm) and thus light source 440 may not include sufficient light emitters for simultaneously generating a full display image. For example, the number of light emitters for a single color may be fewer than the number of pixels (e.g., 2560×1080 pixels) in a display image. The light emitted by light source 440 may be a set of collimated or diverging beams of light.

Before reaching scanning mirror 470, the light emitted by light source 440 may be conditioned by various optical devices, such as collimating lenses or a freeform optical element 460. Freeform optical element 460 may include, for example, a multi-facet prism or another light folding element that may direct the light emitted by light source 440 towards scanning mirror 470, such as changing the propagation direction of the light emitted by light source 440 by, for example, about 90° or larger. In some embodiments, freeform optical element 460 may be rotatable to scan the light. Scanning mirror 470 and/or freeform optical element 460 may reflect and project the light emitted by light source 440 to waveguide display 480, which may include a coupler 482 for coupling the light emitted by light source 440 into waveguide display 480. The light coupled into waveguide display 480 may propagate within waveguide display 480 through, for example, total internal reflection as described above with respect to FIG. 4. Coupler 482 may also couple portions of the light propagating within waveguide display 480 out of waveguide display 480 and towards user's eye 490.

Scanning mirror 470 may include a microelectromechanical system (MEMS) mirror or any other suitable mirrors. Scanning mirror 470 may rotate to scan in one or two dimensions. As scanning mirror 470 rotates, the light emitted by light source 440 may be directed to a different area of waveguide display 480 such that a full display image may be projected onto waveguide display 480 and directed to user's eye 490 by waveguide display 480 in each scanning cycle. For example, in embodiments where light source 440 includes light emitters for all pixels in one or more rows or columns, scanning mirror 470 may be rotated in the column or row direction (e.g., x or y direction) to scan an image. In embodiments where light source 440 includes light emitters for some but not all pixels in one or more rows or columns, scanning mirror 470 may be rotated in both the row and column directions (e.g., both x and y directions) to project a display image (e.g., using a raster-type scanning pattern).

NED device 450 may operate in predefined display periods. A display period (e.g., display cycle) may refer to a duration of time in which a full image is scanned or projected. For example, a display period may be a reciprocal of the desired frame rate. In NED device 450 that includes scanning mirror 470, the display period may also be referred to as a scanning period or scanning cycle. The light generation by light source 440 may be synchronized with the rotation of scanning mirror 470. For example, each scanning cycle may include multiple scanning steps, where light source 440 may generate a different light pattern in each respective scanning step.

In each scanning cycle, as scanning mirror 470 rotates, a display image may be projected onto waveguide display 480 and user's eye 490. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 470 may revert back to the initial position to project light for the first few rows of the next display image or may rotate in a reverse direction or scan pattern to project light for the next display image, where a new set of driving signals may be fed to light source 440. The same process may be repeated as scanning mirror 470 rotates in each scanning cycle. As such, different images may be projected to user's eye 490 in different scanning cycles.

Figure 5:
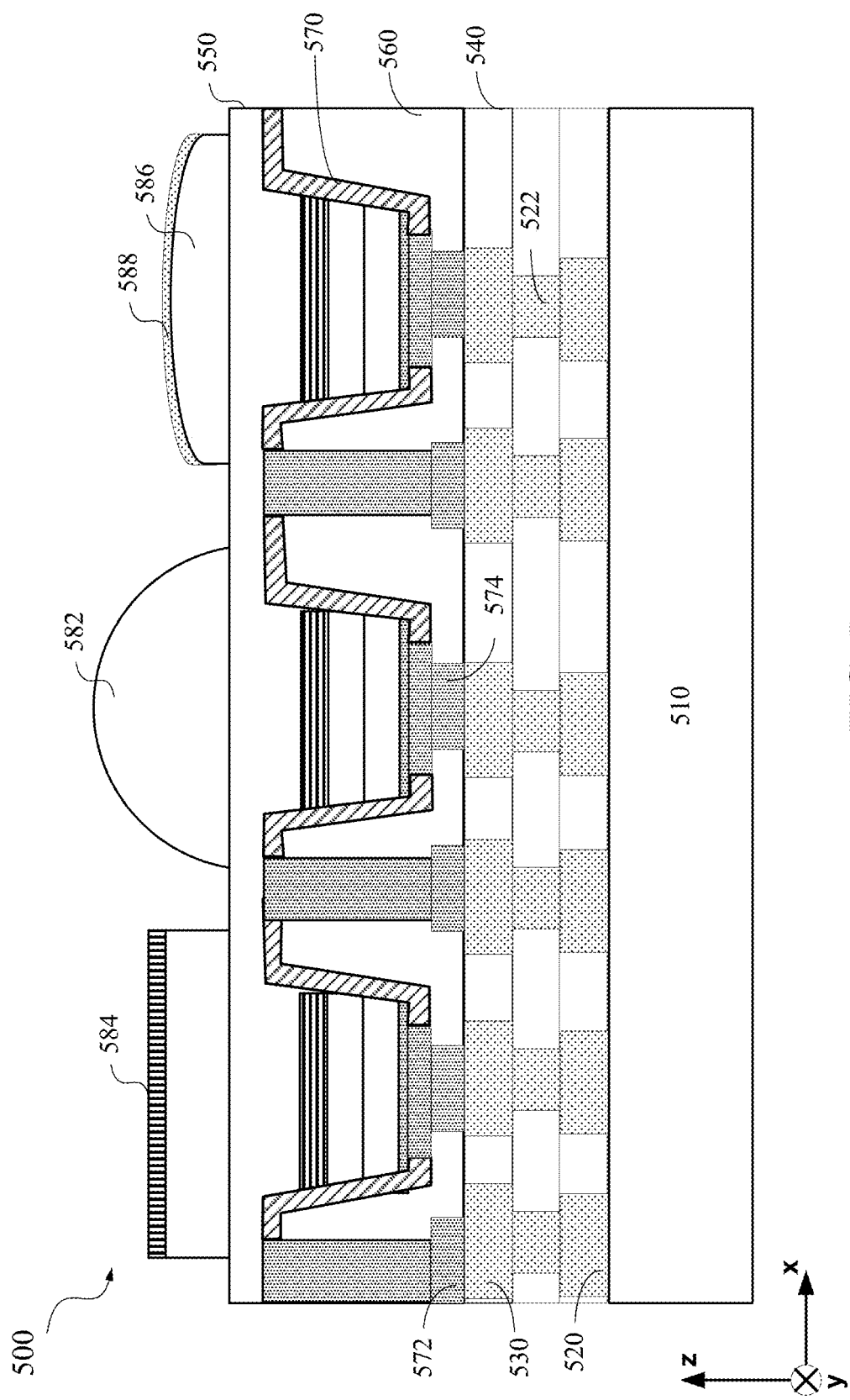
FIG. 5 illustrates an example of an LED array with secondary optical components fabricated thereon according to certain embodiments.

FIG. 5 illustrates an example of an LED array 500 with secondary optical components fabricated thereon according to certain embodiments. LED array 500 may be an example of light source 410 or light source 440. LED array 500 may be made by bonding an LED chip or wafer to a silicon wafer including electrical circuits fabricated thereon, using any suitable bonding techniques, such as wafer-to-wafer, die-to-wafer, or die-to-die bonding using metal-to-metal bonding or hybrid bonding techniques. LED array 500 may include a substrate 510, which may be, for example, a silicon wafer. Integrated circuits 520, such as LED drive circuits, may be fabricated on substrate 510. Integrated circuits 520 may be connected to contacts 574 (n-contacts or p-contacts) and contacts 572 (p-contacts or n-contacts) of micro-LEDs 570 through interconnects 522 and contact pads 530, where contact pads 530 may form metallic bonds with contacts 574 and contacts 572. Dielectric layer 540 on substrate 510 may be bonded to dielectric layer 560 through fusion bonding. Each micro-LED 570 may include a mesa structure that includes an n-type semiconductor layer, an active layer that includes one or more quantum wells, and a p-type semiconductor layer. The mesa structure may include one or more passivation layers and one or more metal layers formed on the sidewall surfaces to electrically and optically isolate micro-LED 570.

The substrate (not shown) of the LED chip or wafer may be thinned or may be removed to expose a semiconductor layer 550 (e.g., an n-type semiconductor layer or a p-type semiconductor layer) of micro-LED 570. Various secondary optical components, such as a spherical micro-lens 582, a grating 584, a micro-lens 586, an antireflection layer 588, light deflectors, meta-structures, and the like, may be formed in or on top of semiconductor layer 550. For example, spherical micro-lens arrays may be etched in the semiconductor materials of micro-LEDs 570 using a gray-scale mask and a photoresist with a linear response to exposure light, or using an etch mask formed by thermal reflowing of a patterned photoresist layer. The secondary optical components may also be etched in a dielectric layer deposited on semiconductor layer 550 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, and the like. In some embodiments, a micro-LED 570 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 5 to show some examples of secondary optical components that can be formed on micro-LEDs 570, which does not necessary imply that different secondary optical components are used simultaneously for every LED array.

Figure 6A:
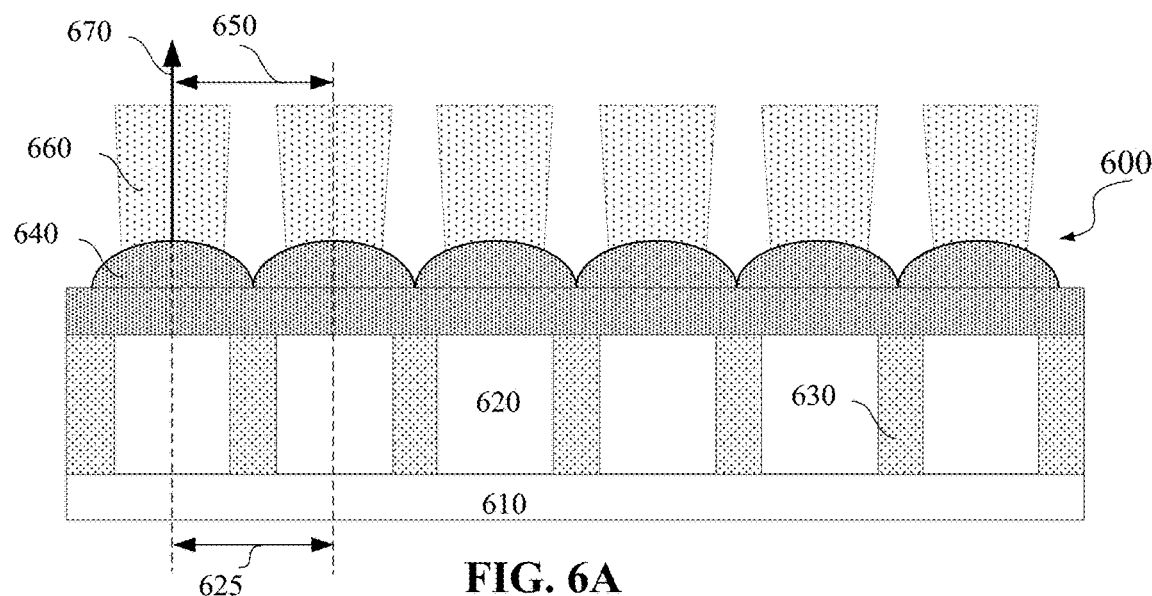
FIG. 6A illustrates an example of a light source including a micro-LED array and a micro-lens array for extracting light from the micro-LED array.

FIG. 6A illustrates an example of a light source 600 including a micro-LED array 620 and a micro-lens array 640 for light extraction from micro-LED array 620. Micro-LED array 620 may include a one-dimensional or two-dimensional array of micro-LEDs, where the micro-LEDs may be uniformly distributed and may be separated by electrical and/or optical insulators 630. Micro-LED array 620 may include epitaxial structures formed on or bonded to a substrate 610, such as a CMOS backplane wafer that includes pixel drive circuits form thereon, as described above. Insulators 630 may include, for example, passivation layers (e.g., semiconductor or dielectric layers), light reflection layers (e.g., reflective metals such as Al, Ag, or Au), filling materials (e.g., polymers or dielectric materials), or a combination thereof.

Micro-lens array 640 may be formed directly on micro-LED array 620 or may be formed on a substrate and then bonded to micro-LED array 620. For example, micro-lens array 640 may be etched in a layer of micro-LED array 620, such as a substrate, a p-doped or n-doped semiconductor layer, or an oxide layer (e.g., a $SiO_2$ layer) of micro-LED array 620, or may be formed on a dielectric layer deposited on micro-LED array 620, such as an oxide layer, a nitride layer, or a polymer layer. In the example shown in FIG. 6A, micro-lens array 640 may align with micro-LED array 620, where a pitch 625 of micro-LED array 620 may be the same as a pitch 650 of micro-lens array 640, and the optical axis of each micro-lens in micro-lens array 640 may align with a center of a respective micro-LED in micro-LED array 620. Thus, the chief ray angle of the light from each micro-LED after passing through the corresponding micro-lens may be the same, such as in the direction of the optical axis or perpendicular to micro-LED array 620. For example, as shown in FIG. 6A, a light beam 660 from each micro-lens in micro-lens array 640 may have a chief ray 670 aligned with the optical axis of the corresponding micro-lens. In the illustrated example, chief ray 670 of light beam 660 may be at 90° with respect to micro-lens array 640 or micro-LED array 620. The focal length and the distance of the micro-lenses from the light emitting regions of corresponding micro-LEDs may be selected such that light beam 660 may be a collimated beam, a converging beam, or a diverging beam.

In some embodiments, pitch 625 of micro-LED array 620 may be the same as pitch 650 of micro-lens array 640, but micro-lens array 640 may not be align with micro-LED array 620, where the optical axis of each micro-lens in micro-lens array 640 may be offset from the center of a respective micro-LED in micro-LED array 620. As such, the chief ray of each light beam after passing through the respective micro-lens may not align with the optical axis of each micro-lens. However, because the pitch matching, the chief rays of the light beams from the micro-LEDs may propagate in the same direction after passing through micro-lens array 640. In some embodiments, to improve the in-coupling efficiency of the light emitted from the micro-LEDs into a waveguide-based display system, it may be desirable that the light beams from the micro-LEDs are directed towards the display optics (e.g., a lens) of the waveguide-based display system at different angles.

Figure 6B:
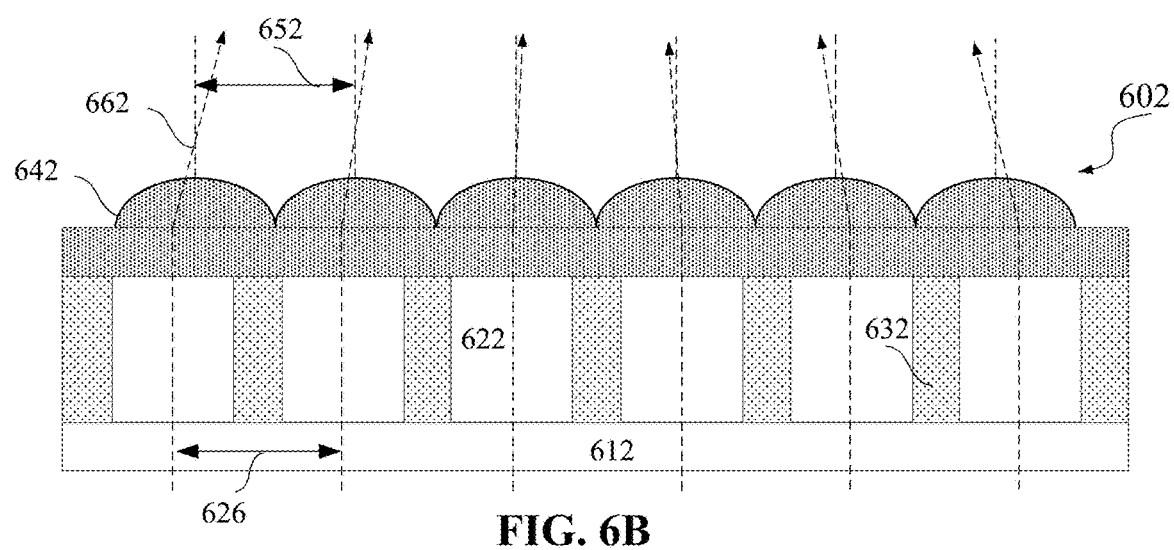
FIG. 6B illustrates an example of a light source including a micro-LED array and a micro-lens array for extracting and converging light from the micro-LED array.

FIG. 6B illustrates an example of a light source 602 including a micro-LED array 622 and a micro-lens array 642 for extracting and converging light from micro-LED array 622. Micro-LED array 622 may include a one-dimensional or two-dimensional array of micro-LEDs, where the micro-LEDs may be uniformly distributed and may be separated by, for example, electrical and/or optical insulators 632. Micro-LED array 622 may include epitaxial structures formed on or bonded to a substrate 612, such as a CMOS backplane wafer that includes pixel drive circuits form thereon. Insulators 632 may include, for example, passivation layers (e.g., semiconductor or dielectric layers), light reflection layers (e.g., reflective metals such as Al, Ag, or Au), filling materials (e.g., polymers or dielectric materials), or a combination thereof.

Micro-lens array 642 may be formed directly on micro-LED array 622 or may be formed on a substrate and then bonded to micro-LED array 622. For example, micro-lens array 642 may be etched in a layer of micro-LED array 622, such as a substrate, a semiconductor layer, or an oxide layer (e.g., a $SiO_2$ layer) of micro-LED array 622, or may be formed on a dielectric layer or semiconductor layer deposited on micro-LED array 622, such as an oxide layer or a SiN layer. The focal length and the distance of the micro-lenses from the light-emitting regions of corresponding micro-LEDs may be selected such that light beam from each micro-lens may be a collimated beam, a converging beam, or a diverging beam.

In the example illustrated in FIG. 6B, a pitch 626 of micro-LED array 622 may be different from (e.g., greater than) a pitch 652 of micro-lens array 642, and thus the optical axis of each micro-lens in micro-lens array 642 may be offset from the center of a respective micro-LED in micro-LED array 622 by a different distance in the x direction and/or the y direction. As such, the chief rays 662 of the light beams from the micro-LEDs after passing through the corresponding micro-lenses may be different. In some embodiments, the offset may be a function of the location of the micro-lens. For example, the offset may linearly increase as a function of the distance of the micro-lens from the center of light source 602, and thus the angle of chief ray 662 of the light beam from a micro-LED with respect to the surface-normal direction of micro-LED array 622 may gradually increase as the distance of the micro-LED from the center of light source 602 increases. As a result, the chief rays 662 of the light beams from the micro-LEDs after passing through the corresponding micro-lenses may be in different directions and may converge as shown in the example.

Figure 6C:
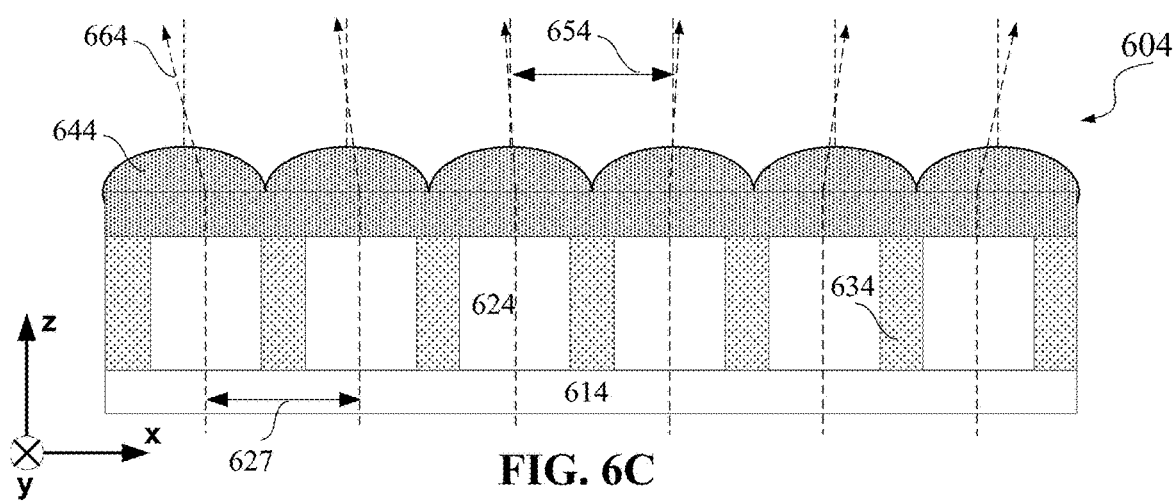
FIG. 6C illustrates an example of a light source including a micro-LED array and a micro-lens array for extracting and diverging light from the micro-LED array.

FIG. 6C illustrates an example of a light source 604 including a micro-LED array 624 and a micro-lens array 644 for extracting and diverging light from micro-LED array 624. Micro-LED array 624 may include a one-dimensional or two-dimensional array of micro-LEDs, where the micro-LEDs may be uniformly distributed and may be separated by, for example, electrical and/or optical insulators 634. Micro-LED array 624 may include epitaxial structures formed on or bonded to a substrate 614. Insulators 634 may include, for example, passivation layers (e.g., semiconductor or dielectric layers), light reflection layers (e.g., reflective metals such as Al, Ag, or Au), filling materials (e.g., polymers or dielectric materials), or a combination thereof.

Micro-lens array 644 may be formed directly on micro-LED array 624 or may be formed on a substrate and then bonded to micro-LED array 624. For example, micro-lens array 644 may be etched in a layer of micro-LED array 624, such as a substrate, a semiconductor layer, or an oxide layer (e.g., a $SiO_2$ layer) of micro-LED array 624, or may be formed on a dielectric layer deposited on micro-LED array 624, such as an oxide layer or a SiN layer. The focal length and the distance of the micro-lenses from the light-emitting regions of the corresponding micro-LEDs may be selected such that light beam from each micro-lens may be a collimated beam, a converging beam, or a diverging beam.

In the example shown in FIG. 6C, a pitch 627 of micro-LED array 624 may be different from (e.g., less than) a pitch 654 of micro-lens array 644, and thus the optical axis of each micro-lens in micro-lens array 644 may be offset from the center of a respective micro-LED in micro-LED array 624 by a different distance in the x direction and/or the y direction. As such, the chief rays 664 of the light beams from the micro-LEDs after passing through the corresponding micro-lenses may be different. The offset of the micro-lens from the corresponding micro-LED may be a function of the location of the micro-lens. For example, the offset may linearly increase as a function of the distance of the micro-lens from the center of light source 604. As a result, the chief rays 664 of the light beams from the micro-LEDs after passing through the corresponding micro-lenses may be in different directions and may diverge as shown in the example.

In various embodiments, the pitch of a micro-lens array may be uniform or non-uniform. For example, the pitch of a two-dimensional micro-lens array may be uniform in two orthogonal directions, uniform in one direction only, or non-uniform in both directions. The pitch may also be the same or different in the two orthogonal directions.

It can be difficult to fabricate the micro-lenses that have curved surfaces as shown in FIGS. 5-6C. In addition, redirecting the emitted light using off-centered micro-lenses or micro-prisms for some light sources may need a precise pixel-level alignment (and thus may be difficult to manufacture), and may have limited deflection angle due to certain geometry limitations. Furthermore, the micro-lenses and micro-prisms may have chromatic aberrations that may reduce image quality.

In some embodiments, flat (or planar) optical devices including nanostructures may be used to extract and redirect light emitted by micro-LEDs. Various combinations of functionalities may be implemented using the flat optical devices (e.g., metasurfaces or meta-structures) through designs of individual nanostructures (which may be referred to as meta-elements, meta-atoms, or nano-antennas) and/or the arrangement of the nanostructures. For example, the flat optical devices may be designed to both focus and deflect the light emitted from a light source (e.g., a micro-LED or a group of micro-LEDs).

A metasurface may include a dense arrangement of sub-wavelength nanostructures that may resonate to modify the phase, amplitude, and/or polarization of incident light by desired values. The modification of the wavefront may be tuned by tuning the material (e.g., dielectric, semiconductor, or metallic materials), size (e.g., diameter or side), geometry (e.g., cylinder or rectangular prism), spatial arrangement (e.g., pitch), orientation (e.g., rotation angle), and environment (e.g., filling material) of the nanostructures and thus the resonant condition of the nanostructures, to achieve various flat optical devices, such as blazed gratings, lenses, polarizers, wave plates, holograms, cubic lenses, Alvarez lenses with tunable focal length, and non-imaging optics (e.g., for cloaking). Metasurfaces can provide continuous control of the phase profile (e.g., from 0 to $2\pi$) using two thickness (or height) levels and different cross-sectional shapes and/or areas, and can reduce high diffraction orders while maintaining the advantages of small size, low weight, and ease of fabrication of planar diffractive optics. Metasurfaces may also be designed to achieve achromatic behavior at multiple wavelengths.

A desired function (e.g., focusing or beam steering/deflecting) of a metasurface may be achieved by constructive interference between multiple wavelets from multiple light paths, where the total phase delay $\varphi_{tot}$ of each wavelet at the point (or plane) of interest may be the sum of a phase shift $\varphi_m(x, y)$ introduced by the metasurface at a corresponding point (x, y) of the metasurface and a phase $\varphi_p(x, y)$ accumulated during propagation from the point (x, y) of the metasurface to the point (or plane) of interest, such as a focal point or a plane perpendicular to a certain direction.

In some embodiments, to design a metasurface for a certain function, Fourier optics may be used to determine the desired phase delay profile that can produce the desired light field distribution in a field of interest. For example, for a blazed grating, a phase delay profile with a linear dependence on the position may be needed, where the phase delay may increase or decrease by $2\pi$ across one grating period. The desired phase delay profile may then be discretized into segments with discrete phases. Each discrete phase delay for a corresponding segment of the discretized phase delay profile may be achieved using a corresponding nanostructure (or nanostructures) by tuning the parameters of the nanostructure, such as the size, shape (or geometry), material, orientation, and the like as described above and below.

Figure 7:
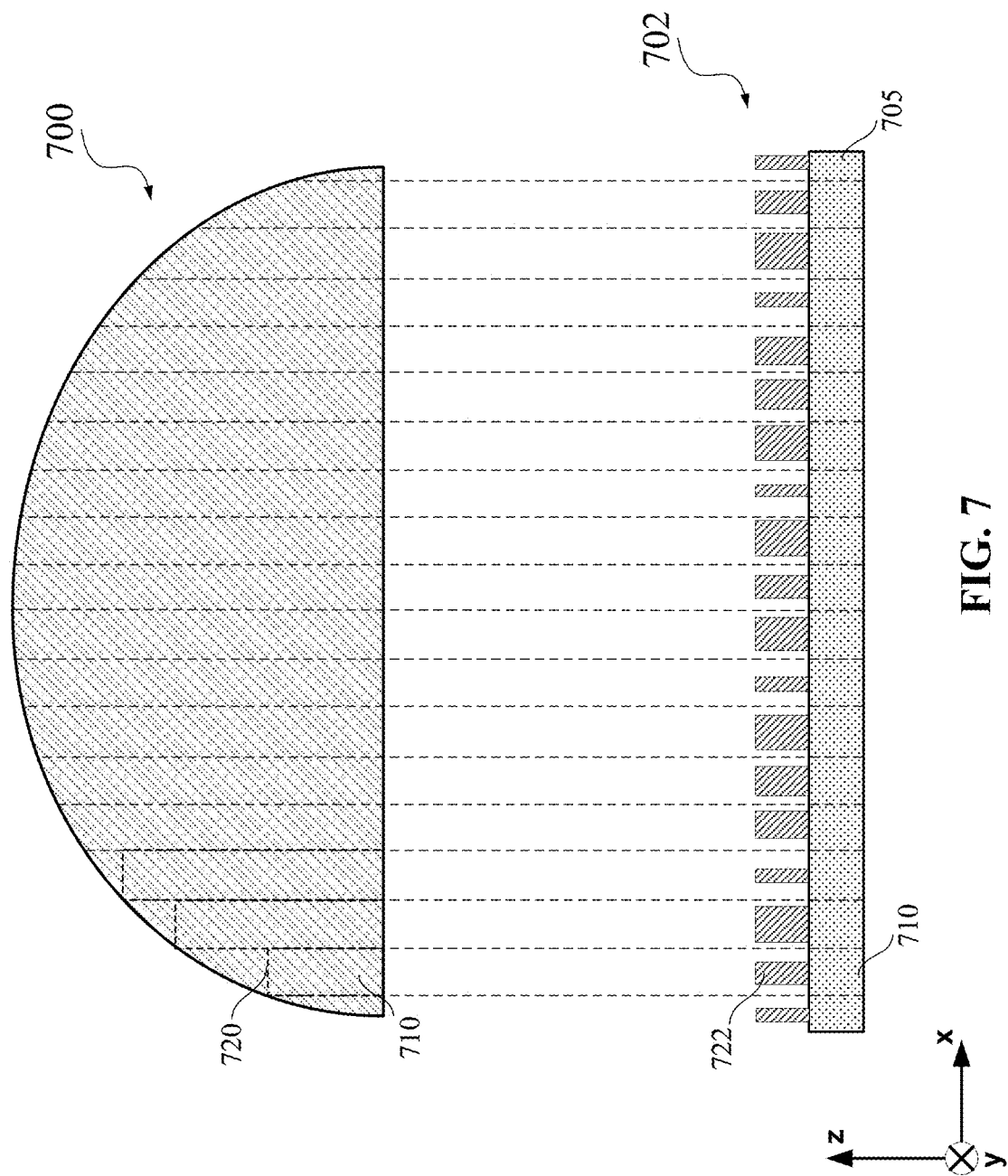
FIG. 7 illustrates an example of achieving the phase delay profile of a refractive lens using a flat lens (e.g., a meta-lens) according to certain embodiments.

FIG. 7 illustrates an example of achieving the phase delay profile of a refractive lens 700 using a flat lens 702 (also referred to as a meta-lens) according to certain embodiments. For a spherical lens, the total phase delay $\varphi_{tot}$ of each wavelet at a focal point may be the sum of the phase shift introduced by the lens at a corresponding point (x, y) and the phase accumulated during propagation from the point (x, y) of the lens to the focal point. Thus, the target phase shift $\varphi_m(x, y, \lambda)$ introduced by a lens with a focal length f at a point (x, y) for each wavelength $\lambda$ may be described by:

$$\varphi_m(x, y, \lambda) = -\frac{2\pi}{\lambda}\left(\sqrt{x^2 + y^2 + f^2} - f\right).$$

The phase delay $\varphi_m(x, y, \lambda)$ at each point (x, y) of the phase delay profile described above may be achieved by a material according to:

$$\varphi_m(x, y, \lambda) = \frac{n \times 2\pi}{\lambda}L,$$

where n is the refractive index of the material and L is the thickness of the material at the point (x, y). In refractive lens 700, the refractive index may be homogeneous, and the phase delay $\varphi_m(x, y, \lambda)$ at each point (x, y) may be achieved by a respective thickness L. In contrast, in flat lens 702, the thickness L may be uniform and the phase delay $\varphi_m(x, y, \lambda)$ at each point (x, y) may be achieved by a respective effective refractive index n.

As shown in FIG. 7, in order to achieve the phase delay profile described above through propagation phase, a lens may be discretized into a finite number of segments 710 according to a certain lattice or grid in the x-y plane. In each segment 710, a meta-element 722 including a high-refractive index material and having a designed geometry may be placed in the segment, to provide a desired effective index n and thus a desired phase delay that may be achieved by a corresponding element 720 of refractive lens 700 at the segment. Meta-elements 722 may be formed on a substrate 705, which may include a transparent material, such as glass, quartz, plastic, crystal, ceramic, and the like. Meta-elements 722 may include, for example, a high-refractive index dielectric material (e.g., $TiO_2$, $ZrO_2$, $HfO_2$, $Ta_2O_5$, $WO_3$, $Nb_2O_5$, $Si_3N_4$, TiN, ZrN, or HfN), a semiconductor material (e.g., GaN or Si), a metal, and the like. Flat lens 702 may include meta-elements that are designed to modify the phase of the incident light differently at different segments such that collimated incident light may be focused onto a same spot (e.g., a focal point) by flat lens 702.

There may be several factors that can affect the performance of an optical metasurface, such as the size of each segment and the shape of each segment. The shape of each segment may affect the effective refractive indices for light of different polarization states. Examples of space discretization or segmentation of a flat optical device may include square discretization and hexagon space discretization. Other discretization schemes may also be used to divide a flat optical device into uniform or nonuniform segments.

Figure 8A:
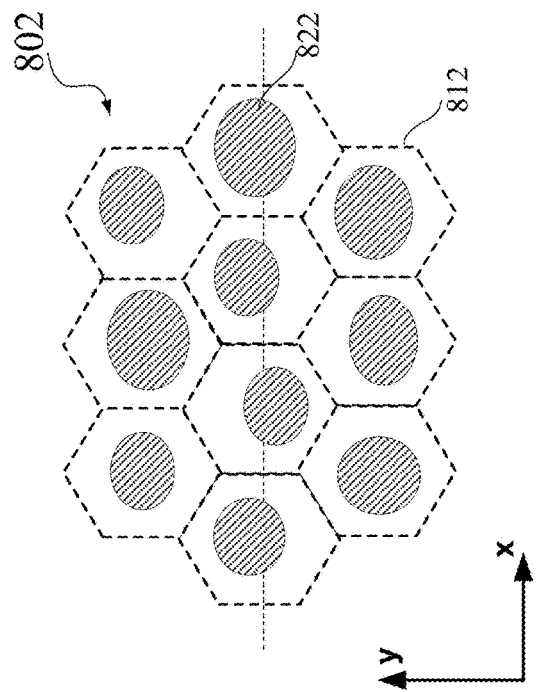
FIG. 8A illustrates an example of a flat optical device (e.g., a meta-lens) including uniform square segments according to certain embodiments.

FIG. 8A illustrates an example of a flat optical device 800 (e.g., a meta-lens) including uniform square segments 810 according to certain embodiments. The uniform square segments 810 may be arranged according to a two-dimensional lattice or grid graph. Each segment 810 may include a meta-element 820 that may have a desired shape and size (and thus a desired fill factor) for achieving a desired effective refractive index and phase delay. Due to the nonuniform geometries and the different arrangements of meta-elements 820 in different segments 810, a segment 810 may have different effective refractive indices for light of different polarization directions.

Figure 8B:
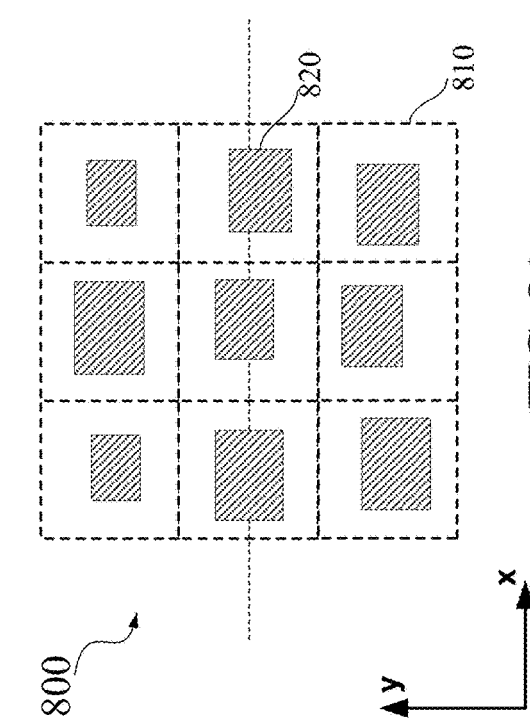
FIG. 8B illustrates an example of a flat optical device (e.g., a meta-lens) including hexagonal segments according to certain embodiments.

FIG. 8B illustrates an example of a flat optical device 802 (e.g., a meta-lens) including hexagonal segments 812 according to certain embodiments. Each segment 812 may include a meta-element 822 that may have a desired shape and size (and thus a desired fill factor) for achieving a desired effective refractive index and phase delay. Meta-elements 822 in hexagonal segments 812 may have nonuniform geometries and arrangements, and thus the effective refractive index at a hexagonal segment 812 may be different for light of different polarization directions.

Figure 8C:
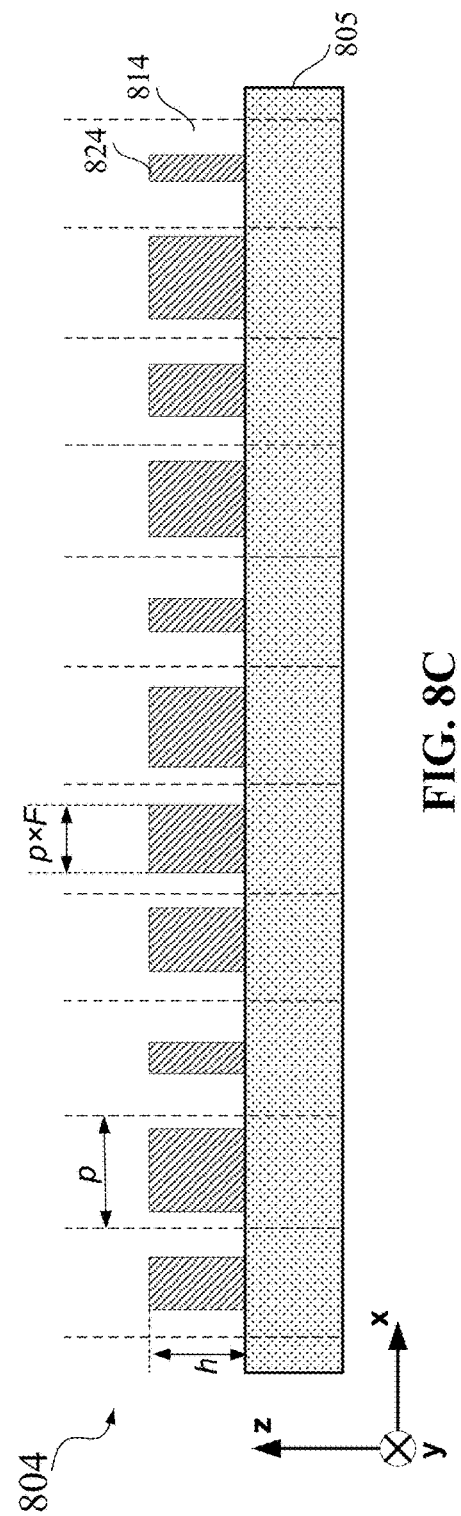
FIG. 8C includes a cross-sectional view of an example of a flat optical device (e.g., a meta-lens) according to certain embodiments.

FIG. 8C includes a cross-sectional view of an example of a flat optical device 804 (e.g., a meta-lens) according to certain embodiments. Flat optical device 804 may be the cross-sectional view of flat optical device 800 or 802. In the illustrated example, flat optical device 804 may include a substrate 805 and nanostructures formed thereon. As described above, substrate 805 may include any suitable substrate that may include a planar surface or a curved surface. In one example, substrate 805 may include a micro-LED wafer with a 2-D array of micro-LEDs fabricated thereon. The nanostructures may have a uniform thickness h. An x-y plane of flat optical device 804 may be divided into segments 814 arranged according to a two-dimensional lattice or grid as show in, for example, FIGS. 8A and 8B. In the example shown in FIG. 8C, the two-dimensional grid may have a pitch p in the x direction and/or y direction.

Each segment 814 may include one or more meta-elements 824. Meta-elements 824 may include a material that has a high refractive index and a low absorption for incident light (e.g., visible light), such as $TiO_2$, $ZrO_2$, $HfO_2$, $Ta_2O_5$, $WO_3$, $Nb_2O_5$, $GaN$, $Si_3N_4$, $TiN$, $ZrN$, $HfN$ for visible light. The high-refractive index material may enable small pitch size and low thickness, while achieving a phase delay coverage. Meta-elements 824 may have regular, irregular, or arbitrary shapes. For example, each meta-element 824 may be characterized by a cross-sectional shape of a rectangle, a square, a polygon, a circle, an oval, a ring, a polygon with an aperture, or an irregular shape. The size of each meta-element 824 may be designed to have a desired fill factor F in each segment in order to achieve a desired phase delay. The fill factor F represents the percentage of the period (e.g., length in a 1-D segment and area in a 2-D segment) that is filled with the high-refractive index material. Even though not shown in FIG. 8C, regions between meta-elements 824 may be filled with a low-refractive index material, such as $SiO_2$.

Figure 9B:
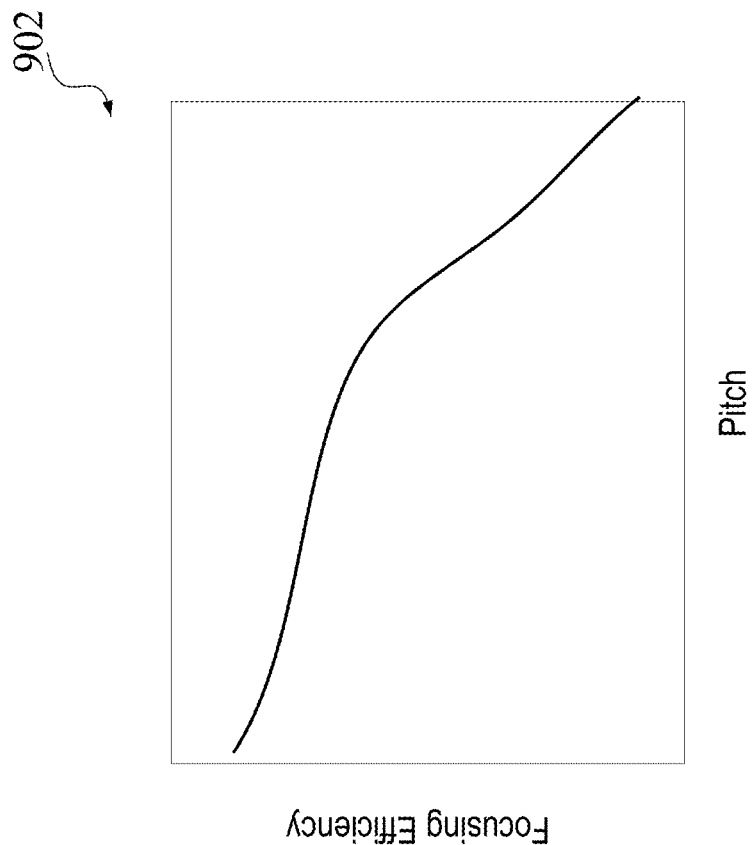
FIG. 9B includes a diagram illustrating an example of a relationship between the pitch of the segments and the focusing efficiency of a meta-lens.
Figure 9A:
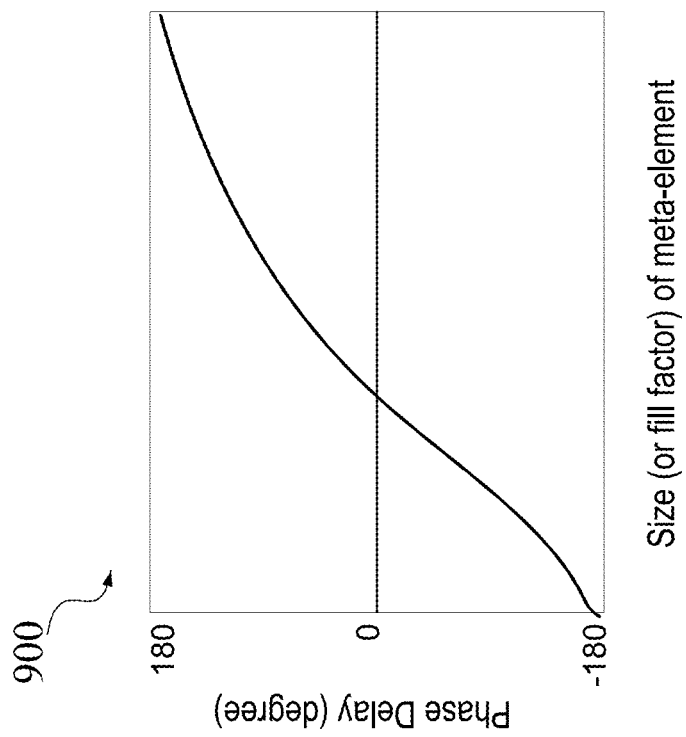
FIG. 9A includes a diagram illustrating an example of a relationship between the meta-element size (or fill factor) and the corresponding phase shift of the meta-element in an example of a metasurface.

FIG. 9A includes a diagram 900 illustrating an example of a relationship between the meta-element size (or fill factor) and the corresponding phase shift of the meta-element in an example of a metasurface. As illustrated, the phase delay of a meta-element may approximately linearly change with the size of the meta-element or the fill factor of the meta-element in a segment. As described above, the refractive index of the material of the meta-elements may need to be high (e.g., greater than about 2.0, 2.5, 2.7, or higher) in order to achieve the a phase delay coverage for a small-pitch metasurface with a low thickness (e.g., less than about 1 μm).

In order to increase the efficiency of an optical metasurface, the effect of the phase delay discretization caused by the space discretization may need to be minimized. Ideally, the size of each segment may need to be as small as possible to reduce the influence of space discretization, such that the phase delay profile of the optical metasurface may be as close to the ideal phase delay profile without discretization as possible. When the pitch of the segments is small, each segment may be close to a point, and the fill factors of the segments may be gradually changed to gradually change the effective refractive index as the point, thereby achieving a substantially smooth phase profile of a lens as described above. In general, the smaller the pitch (or period) of the segments, the better the performance of the optical metasurface.

FIG. 9B includes a diagram 902 illustrating an example of a relationship between the pitch of the segments and the focusing efficiency of a meta-lens. As illustrated, the focusing efficiency of the meta-lens may decrease as the pitch of the segments of the meta-lens increases. For example, to achieve a relatively high focusing efficiency (e.g., about 50% or higher) for visible light, the pitch of the segments of the meta-lens may need to be less than about 500 nm, less than about 400 nm, less than about 350 nm, less than about 300 nm, less than about 250 nm, less than about 200 nm, or smaller.

In addition, to achieve a diffraction-limited focus, the segment size may need to be smaller than the Abby's diffraction limit $\lambda/(2NA)$, where NA is the numerical aperture of the lens. To make a meta-lens with a high numerical aperture, the pitch of the segments may need to be a fraction of the wavelength, such as less than about 500 nm, less than about 400 nm, less than about 350 nm, less than about 300 nm, less than about 250 nm, less than about 200 nm, or smaller for visible light.

However, the pitch of the segments and the feature size of a meta-element in a metasurface may be limited by existing nanofabrication techniques. For example, the feature size of a meta-lens for visible light may range from about 20 to about 40 nm, which may be difficult to achieve because the resolution of photo-lithography may be limited by the diffraction limit of the photolithography tools. It may also be difficult to make a single layer metasurface with a pitch of the segments less than about 500 nm, such as about 300 nm, about 200 nm, or smaller. Some lithography techniques, such as e-beam lithography (EBL), may achieve a better resolution, but may significantly increase the processing time compared with photo-lithography methods. In addition, when the refractive index of the material of the meta-elements is not sufficiently high (e.g., greater than about 2.5, 2.7, 3, or higher), the meta-elements may need to have a higher height or thickness to achieve the desired effective refractive index, which may result in high-aspect-ratio meta-elements and may increase the fabrication difficulty.

According to certain embodiments, flat optical devices, such as flat lenses implemented using multilayer metasurfaces, may be used to extract, collimate, and/or redirect light emitted by light sources to user's eyes. The flat optical devices may each include multiple flat layers of nanostructures, where each flat layer of nanostructures may generate a portion of the total phase delay at a given segment of the flat optical device to approximate the ideal phase delay profile of an optical device, such as a lens. To achieve a higher manufacturing yield, the segments in each flat layer of nanostructures may have a relatively large pitch (e.g., greater than the diffraction limit of the photolithography technique used to pattern the nanostructures), and thus each flat layer of the flat optical device may be relatively easy to fabricate using existing photo-lithography techniques. To improve the efficiency of the flat optical device, the segments of each flat layer of the multiple flat layers of the flat optical device may be shifted with respect to the segments of other flat layers, such that the effective pitch of the resultant segments (and the effective size of each resultant segment) of the flat optical device may be reduced and the resolution of the discretization of the ideal phase delay profile may be improved. For example, if the flat optical device includes two layers of nanostructures and the segments of the second layer are shifted with respect to the first layer by a half of the pitch p of the segments in each layer in each direction (e.g., x or y direction), the effective pitch of the resultant segments of the flat optical device may be reduced to p/2 in each direction, and the effective size of each resultant segment of the two-layer flat optical device may be reduced to a quarter of the size of each segment in a single layer. As such, the efficiency of the flat optical device can be improved significantly. The flat optical devices disclosed herein may be manufactured using standard nanofabrication processes that are compatible with CMOS, NMOS, PMOS, TFT, or other display-related fabrication processes.

Figure 10A:
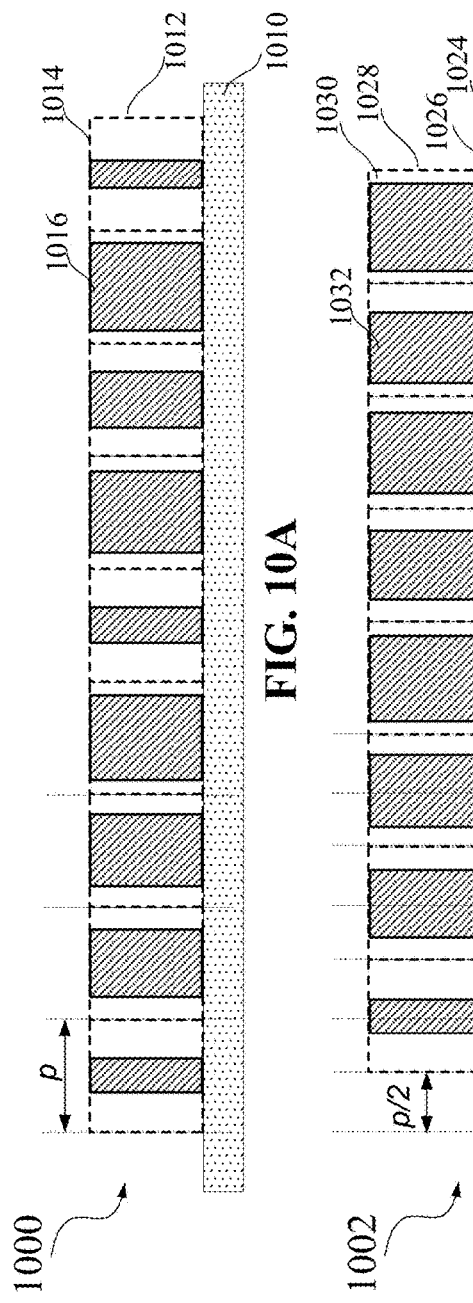
FIG. 10A illustrates an example of a flat optical device including a single layer of nanostructures.

FIG. 10A illustrates an example of a flat optical device 1000 (e.g., a meta-lens) including a single layer of nanostructures. In the illustrated example, flat optical device 1000 may include a substrate 1010 and a layer of nanostructures 1012 formed on substrate 1010. Substrate 1010 may be similar to substrate 705 or 805 described above. The layer of nanostructures 1012 may include meta-elements 1016 positioned in an array of segments 1014. In some embodiments, each segment 1014 may include one meta-element 1016. In some embodiments, each meta-element 1016 may be positioned at the center of a respective segment 1014. The pitch of the array of segments 1014 in the x direction is p. Meta-elements 1016 in the layer of nanostructures 1012 may have the same height. As described above with respect to meta-element 824, meta-elements 1016 may include a high-refractive index material, such as $TiO_2$, $ZrO_2$, $HfO_2$, $Ta_2O_5$, $WO_3$, $Nb_2O_5$, GaN, $Si_3N_4$, TiN, ZrN, HfN, or a combination, and may have desired shapes, sizes, and orientations to achieve desired phase delays (e.g., the phase shift profile of a lens) at different locations (e.g., segments) of flat optical device 1000. Even though not shown in FIG. 10A, regions between meta-elements 1016 may be filled with a low-refractive index material, such as $SiO_2$.

Figure 10B:
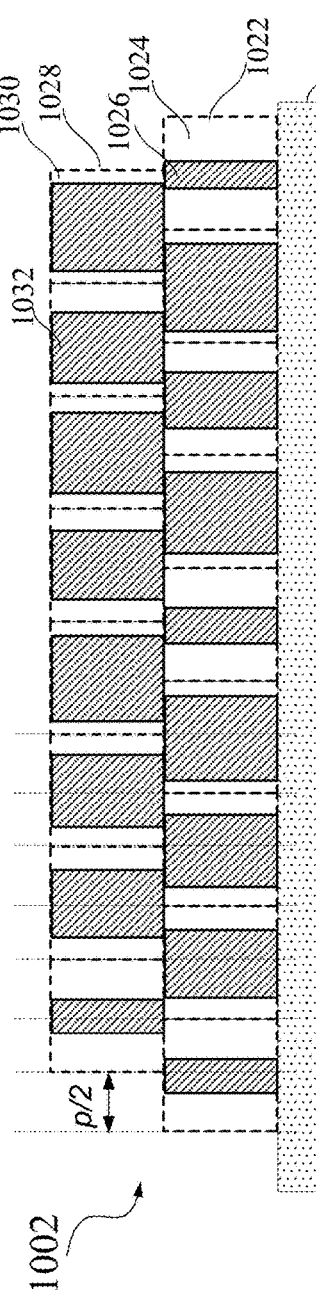
FIG. 10B illustrates an example of a flat optical device including two layers of nanostructures with relatively shifted segments according to certain embodiments.

FIG. 10B illustrates an example of a flat optical device 1002 (e.g., a meta-lens) including two layers of nanostructures with relatively shifted segments according to certain embodiments. In the illustrated example, flat optical device 1002 may include a substrate 1020 and two layers of nanostructures formed on substrate 1020. Substrate 1020 may be similar to substrate 1010 described above. The two layers of nanostructures formed on substrate 1020 may include a first layer of nanostructures 1022 and a second layer of nanostructures 1028. The first layer of nanostructures 1022 may include meta-elements 1026 positioned in an array of segments 1024. In some embodiments, each segment 1024 may include one meta-element 1026. In some embodiments, each meta-element 1026 may be positioned at the center of a respective segment 1024. The pitch of the array of segments 1024 in the x direction is p. Meta-elements 1026 in the first layer of nanostructures 1022 may have the same height. The second layer of nanostructures 1028 may include meta-elements 1032 positioned in an array of segments 1030. The pitch of the array of segments 1030 in the x direction is p. Meta-elements 1032 in the second layer of nanostructures 1028 may have the same height, which may be the same or different from the height of meta-elements 1026 in the first layer of nanostructures 1022.

In the example shown in FIG. 10B, the array of segments 1030 in the second layer of nanostructures 1028 may be shifted by p/2 in the x direction and/or the y direction with respect to the array of segments 1024 in the first layer of nanostructures 1022. At least one meta-element 1032 of the second layer of nanostructures 1028 may overlap with at least a portion of each meta-element 1026 of two adjacent meta-elements 1026 of the first layer of nanostructures 1022 in the x dimension or the y direction. Due to the shift of the array of segments 1030 with respect to the array of segments 1024, the effective pitch of the resultant segments of flat optical device 1002 may be p/2 in the x direction and/or the y direction. Meta-elements 1026 and meta-elements 1032 may include a high-refractive index material as described above, and may have desired shapes, sizes, and orientations, such that the combination of at least a portion of a meta-element 1026 and at least a portion of a meta-element 1032 in a resultant segment of flat optical device 1002 may cause a desired phase delay at the corresponding segment. Therefore, the effective size of each segment of flat optical device 1002 may be reduced to a quarter of the size of each segment 1024 or 1030 in an x-y plane, and thus the resolution of the discretization may be improved by 3 times, which may result in a significant improvement in the efficiency of flat optical device 1002.

Figure 10C:
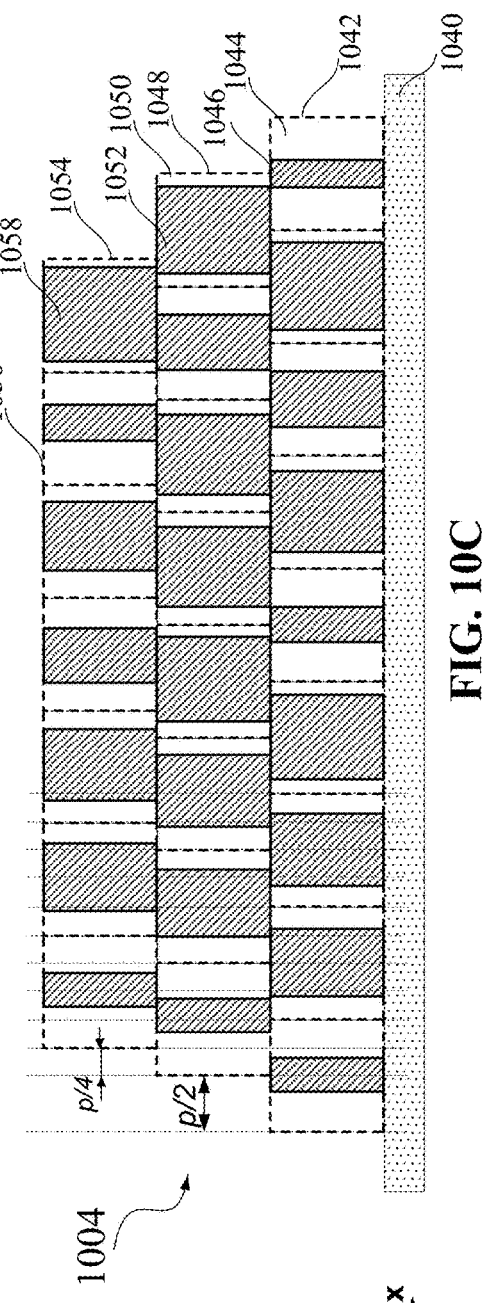
FIG. 10C illustrates an example of a flat optical device including three layers of nanostructures with relatively shifted segments according to certain embodiments.

FIG. 10C illustrates an example of a flat optical device 1004 (e.g., a meta-lens) including three layers of nanostructures with relatively shifted segments according to certain embodiments. In the illustrated example, flat optical device 1004 may include a substrate 1040 and three layers of nanostructures formed on substrate 1040. Substrate 1040 may be similar to substrate 1010 described above. The three layers of nanostructures formed on substrate 1020 may include a first layer of nanostructures 1042, a second layer of nanostructures 1048, and a third layer of nanostructures 1054. The first layer of nanostructures 1042 may include meta-elements 1046 positioned in an array of segments 1044. The pitch of the array of segments 1044 in the x direction or the y direction is p. Meta-elements 1046 in the first layer of nanostructures 1042 may have the same height. The second layer of nanostructures 1048 may include meta-elements 1052 positioned in an array of segments 1050. The pitch of the array of segments 1050 in the x direction or the y direction is p. Meta-elements 1052 in the second layer of nanostructures 1048 may have the same height, which may be the same or different from the height of meta-elements 1046 in the first layer of nanostructures 1042. The third layer of nanostructures 1054 may include meta-elements 1058 positioned in an array of segments 1056. The pitch of the array of segments 1056 in the x direction or y direction is p. Meta-elements 1058 in the third layer of nanostructures 1054 may have the same height, which may be the same or different from the height of meta-elements 1046 in the first layer of nanostructures 1042 and the height of meta-elements 1052 in the second layer of nanostructures 1048.

In the example shown in FIG. 10C, the array of segments 1050 in the second layer of nanostructures 1048 may be shifted by p/2 in the x direction and/or the y direction with respect to the array of segments 1044 in the first layer of nanostructures 1042, and the array of segments 1056 in the third layer of nanostructures 1054 may be shifted by p/4 in the x direction and/or the y direction with respect to the array of segments 1050 in the second layer of nanostructures 1048. At least one meta-element 1052 of the second layer of nanostructures 1048 may overlap with at least a portion of each meta-element 1046 of two adjacent meta-elements 1046 of the first layer of nanostructures 1042 in the x dimension or the y direction. Due to the shift of the array of segments 1050 with respect to the array of segments 1044 and the shift of the array of segments 1056 with respect to the array of segments 1050, the effective pitch of the resultant segments of flat optical device 1004 may be p/4 in the x direction and/or the y direction.

Meta-elements 1046, meta-elements 1052, and meta-elements 1058 may include a high-refractive index material as described above, and may have desired shapes, sizes, and orientations, such that the combination of at least a portion of a meta-element 1046, at least a portion of a meta-element 1052, and at least a portion of meta-element 1058 in a segment of flat optical device 1004 may cause a desired phase delay at the corresponding segment. Therefore, the size of each resultant segment of flat optical device 1004 may be reduced to $\frac{1}{16}$ of the size of each segment 1044, 1050, or 1056 in an x-y plane, and thus the resolution of the discretization may be improved by 15 times, which may result in a significant improvement in the efficiency of flat optical device 1002.

Figure 10D:
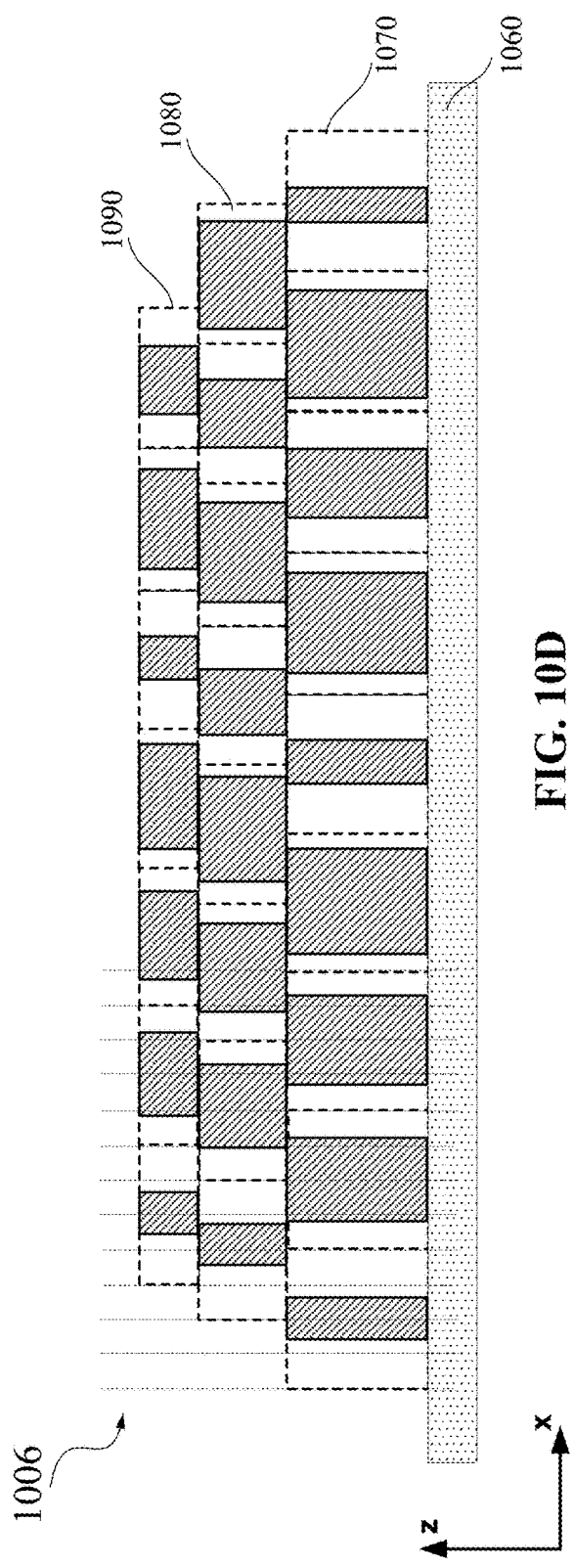
FIG. 10D illustrates an example of a flat optical device including three layers of nanostructures with relatively shifted segments and different thicknesses according to certain embodiments.

FIG. 10D illustrates an example of a flat optical device 1006 (e.g., a meta-lens) including three layers of nanostructures with relatively shifted segments and different thicknesses according to certain embodiments. In the illustrated example, flat optical device 1006 may include a substrate 1060 and three layers of nanostructures formed on substrate 1060. Substrate 1060 may be similar to substrate 1010 described above. The three layers of nanostructures formed on substrate 1060 may include a first layer of nanostructures 1070, a second layer of nanostructures 1080, and a third layer of nanostructure 1090. The first layer of nanostructures 1070 may include meta-elements positioned in an array of segments, where the pitch of the array of segments in the x direction or the y direction is p. The meta-elements in the first layer of nanostructures 1070 may have the same height. The second layer of nanostructures 1080 may include meta-elements positioned in an array of segments, where the pitch of the array of segments in the x direction or the y direction is p. The meta-elements in the second layer of nanostructures 1080 may have the same height, which may be different from the height of the meta-elements in the first layer of nanostructures 1070. The third layer of nanostructures 1090 may include meta-elements positioned in an array of segments, where the pitch of the array of segments in the x direction or the y direction is p. The meta-elements in the third layer of nanostructures 1090 may have the same height, which may be different from the height of the meta-elements in the first layer of nanostructures 1070 and the height of the meta-elements in the second layer of nanostructures 1080.

In the example shown in FIG. 10D, the array of segments in the second layer of nanostructures 1080 may be shifted by p/2 with respect to the array of segments in the first layer of nanostructures 1070, and the array of segments in the third layer of nanostructures 1090 may be shifted by p/4 with respect to the array of segments in the second layer of nanostructures 1080. Due to the relative shift of the arrays of segments in the three layers of nanostructures, the effective pitch of the resultant segments of flat optical device 1006 may be p/4 in the x direction and/or the y direction. The meta-elements may include a high-refractive index material as described above, and may have desired shapes, sizes, and orientations, such that the combination of the meta-element in a segment of flat optical device 1006 may cause a desired phase delay at the corresponding segment. Therefore, the size of each resultant segment of flat optical device 1006 may be reduced to $\frac{1}{16}$ of the size of each segment of a single layer in an x-y plane, and thus the resolution of the discretization may be improved by 15 times, which may result in a significant improvement in the efficiency of flat optical device 1006. In addition, the thicknesses of the three layers of nanostructures can be different, which may increase the number of possible phase delay levels at each segment and improve the matching between the actual phase delay and the desired phase delay at each segment, without the need to reduce the minimum feature size of the meta-elements in each layer.

Figure 10E:
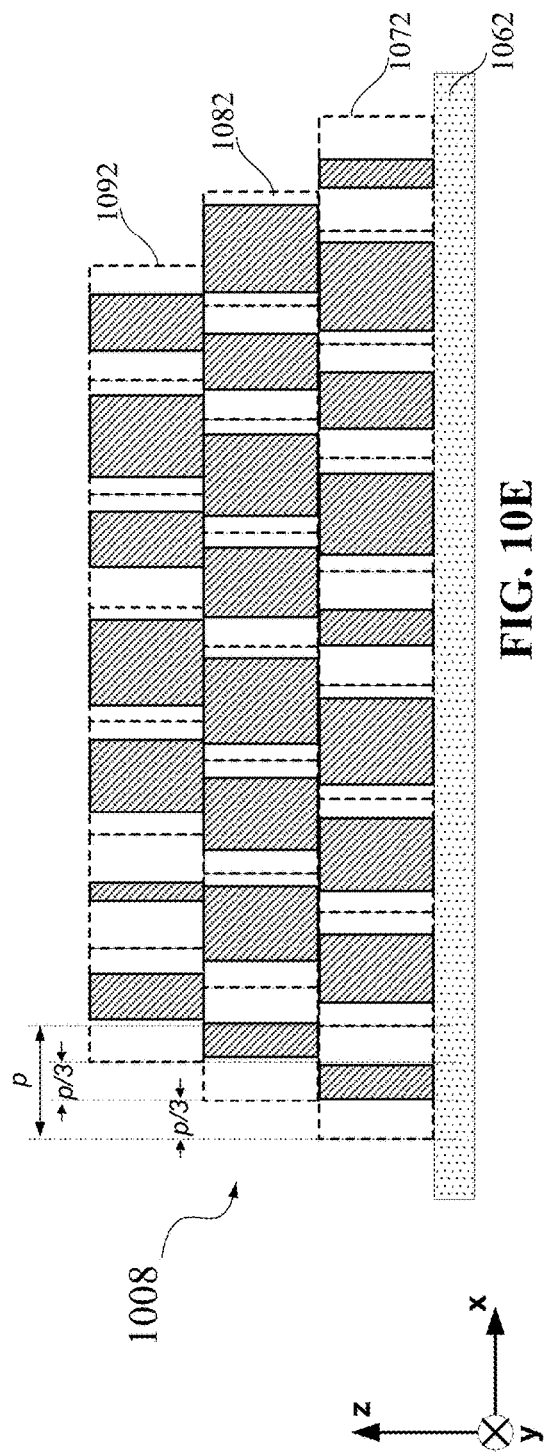
FIG. 10E illustrates another example of a flat optical device including three layers of nanostructures with relatively shifted segments according to certain embodiments.

FIG. 10E illustrates another example of a flat optical device 1008 (e.g., a meta-lens) including three layers of nanostructures with relatively shifted segments according to certain embodiments. In the illustrated example, flat optical device 1008 may include a substrate 1062 and three layers of nanostructures formed on substrate 1062. Substrate 1062 may be similar to substrate 1010 described above. The three layers of nanostructures formed on substrate 1062 may include a first layer of nanostructures 1072, a second layer of nanostructures 1082, and a third layer of nanostructure 1092. The first layer of nanostructures 1072 may include meta-elements positioned in an array of segments, where the pitch of the array of segments in the x direction or y direction is p. The meta-elements in the first layer of nanostructures 1072 may have the same height. The second layer of nanostructures 1082 may include meta-elements positioned in an array of segments, where the pitch of the array of segments in the x direction or y direction is p. The meta-elements in the second layer of nanostructures 1082 may have the same height, which may be the same as or different from the height of the meta-elements in the first layer of nanostructures 1072. The third layer of nanostructures 1092 may include meta-elements positioned in an array of segments, where the pitch of the array of segments in the x direction or the y direction is p. The meta-elements in the third layer of nanostructures 1092 may have the same height, which may be the same as or different from the height of the meta-elements in the first layer of nanostructures 1072 and the height of the meta-elements in the second layer of nanostructures 1082.

In the example shown in FIG. 10E, the array of segments in the second layer of nanostructures 1082 may be shifted by p/3 with respect to the array of segments in the first layer of nanostructures 1072, and the array of segments in the third layer of nanostructures 1092 may be shifted by p/3 with respect to the array of segments in the second layer of nanostructures 1082. Due to the relative shift of the arrays of segments in the three layers of nanostructures, the effective pitch of the resultant segments of flat optical device 1008 may be p/3 in the x direction and/or y direction. The meta-elements may include a high-refractive index material as described above, and may have desired shapes, sizes, and orientations, such that the combination of the meta-element in a segment of flat optical device 1008 may cause a desired phase delay at the corresponding segment. Therefore, the size of each resultant segment of flat optical device 1008 may be reduced to ⅑ of the size of each segment of a single layer in an x-y plane, and thus the resolution of the discretization may be improved by 8 times, which may result in a significant improvement in the efficiency of flat optical device 1008.

Figure 11B:
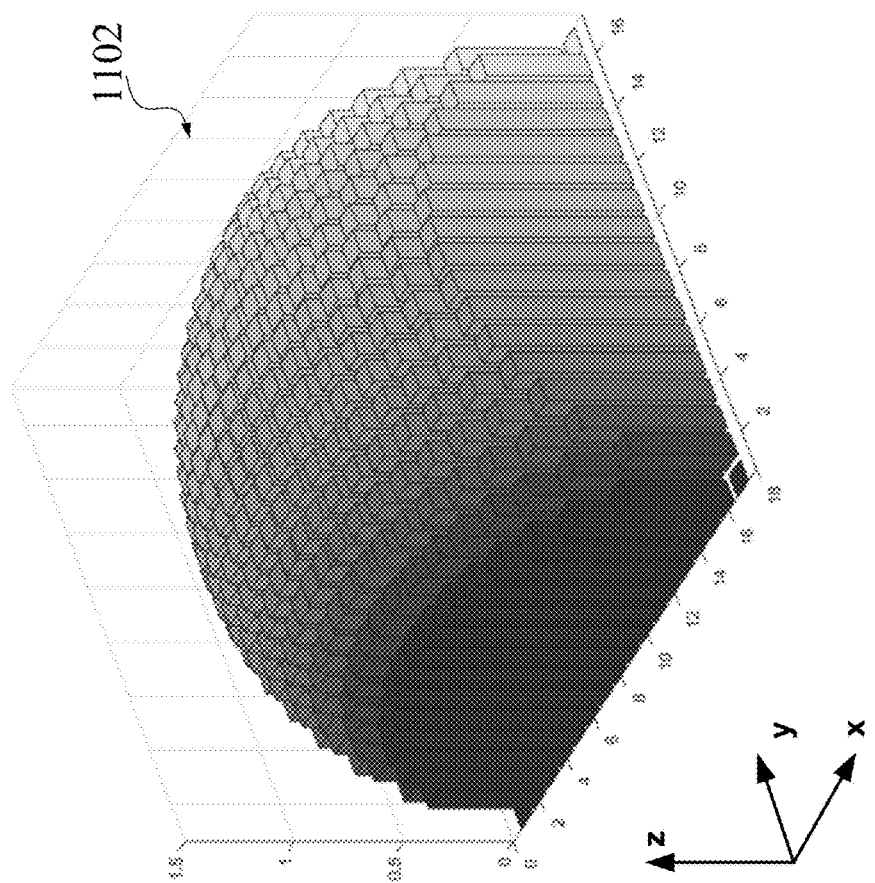
FIG. 11B illustrates a phase delay map of an example of a flat micro-lens including three layers of nanostructures having relatively shifted segments according to certain embodiments.
Figure 11A:
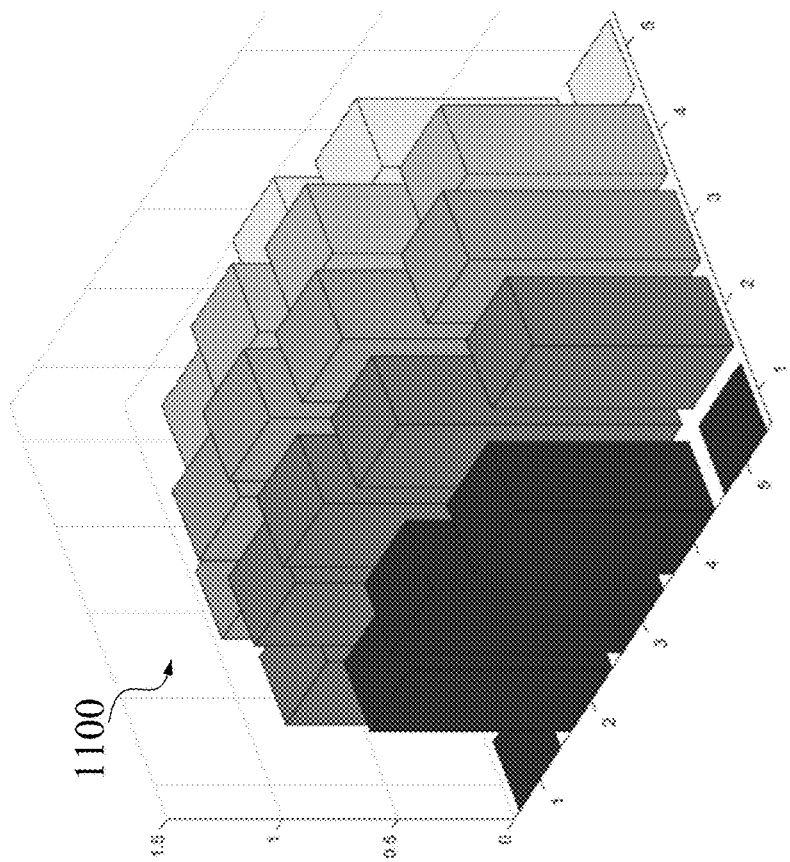
FIG. 11A illustrates a phase delay map of an example of a flat micro-lens including a single layer of nanostructures.

FIG. 11A illustrates a phase delay map 1100 of an example of a flat micro-lens including a single layer of nanostructures. In the illustrated example, due to the limitation of the existing nanofabrication techniques, the flat micro-lens may be divided into a 5×5 array of segments, each segment having a meta-element that can cause a respective phase delay of incident light. As illustrated, due to the relatively large segments, a large area of the flat micro-lens may have the same phase delay, and there may be a large phase delay difference between adjacent segments. As such, there may be a large difference between phase delay map 1100 and the ideal phase delay map of a micro-lens. Therefore, the efficiency of the fabricated flat micro-lens may be low.

FIG. 11B illustrates a phase delay map 1102 of an example of a flat micro-lens including three layers of nanostructures having relatively shifted segments according to certain embodiments. The flat micro-lens of FIG. 11B may have the same aperture size as the flat micro-lens of FIG. 11A in the x-y plane. In the illustrated example, the segments in each layer of the three layers of nanostructures may be shifted with respect to other layers as describe above with respect to, for example, FIGS. 10C-10E. Therefore, there may effectively be an 18×18 array of segments, each segment having a combination of meta-elements that can cause a respective phase delay of incident light. As illustrated, the area of the flat micro-lens with the same phase delay may be much smaller, and the phase delay difference between adjacent segments may also be much smaller. As such, phase delay map 1102 may be much closer to the ideal phase delay map of a micro-lens than phase delay map 1100. Therefore, the efficiency of the fabricated flat micro-lens can be high.

Figure 12A:
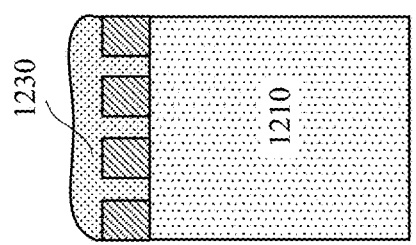
FIGS. 12A-12K illustrate an example of a process of fabricating a flat optical device including multiple layers of nanostructures with shifted segments according to certain embodiments.
Figure 12B:
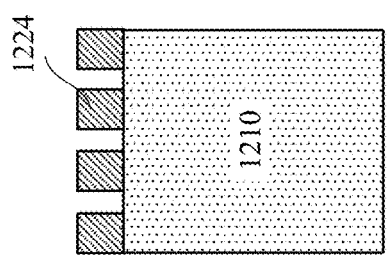
Figure 12C:
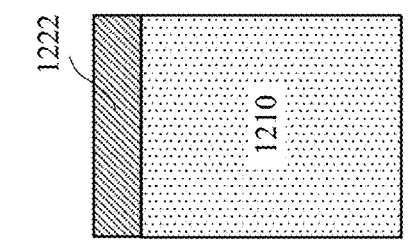
Figure 12D:
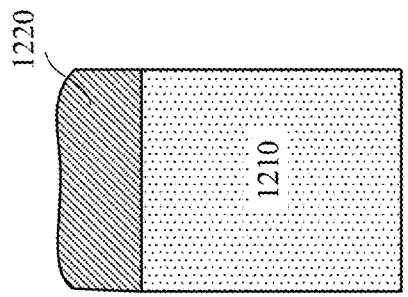
Figure 12E:
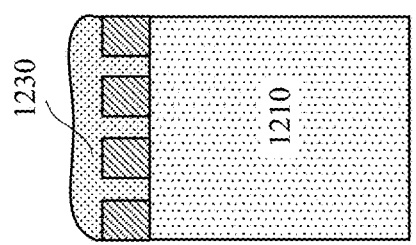
Figure 12F:
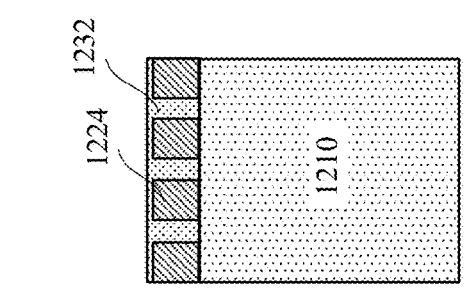

FIGS. 12A-12K illustrate an example of a process of fabricating a flat optical device including multiple layers of nanostructures with shifted segments according to certain embodiments. FIG. 12A shows an example of a substrate 1210, which may be, for example, a wafer including an array of micro-LED fabricated thereon as described above with respect to, for example, FIG. 5. FIG. 12B shows that a high-refractive index material layer 1220 may be deposited on substrate 1210. As described above, the high-refractive index material layer 1220 may include, for example, $TiO_2$, $ZrO_2$, $HfO_2$, $Ta_2O_5$, $WO_3$, $Nb_2O_5$, GaN, $Si_3N_4$, TiN, ZrN, HfN, or a combination. Different deposition techniques may be used to deposit different high-refractive index materials based on their compositions. For example, atomic layer deposition (ALD) techniques may be used to deposit $TiO_2$, and metal-oxide chemical vapor deposition (MOCVD) techniques may be used to deposit GaN. There may be more choices for the deposition of silicon nitride, such as magnetron sputter and plasma enhance chemical vapor deposition (PECVD). FIG. 12C shows that the high-refractive index material layer 1220 may be polished or planarized using, for example, chemical mechanical polishing (CMP) techniques, to planarize and thin high-refractive index material layer 1220, such that the remaining portion 1222 of high-refractive index material layer 1220 may be flat and may have the desired thickness for the first nanostructure layer. FIG. 12D shows that the remaining portion 1222 of high-refractive index material layer 1220 may be patterned using various photolithography techniques and various wet or dry etching techniques to form meta-elements 1224 of desired shapes, sizes, and orientations. FIG. 12E shows that a low-index dielectric layer 1230 (e.g., $SiO_2$) may be deposited on meta-elements 1224. Low-index dielectric layer 1230 may fill the gaps between meta-elements 1224 and may also be on top of meta-elements 1224. FIG. 12F shows that low-index dielectric layer 1230 may be polished or planarized to form a flat first nanostructure layer that includes meta-elements 1224 with the low-index dielectric material in regions 1232 between meta-elements 1224.

Figure 12G:
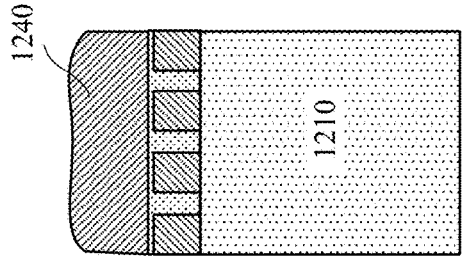
Figure 12H:
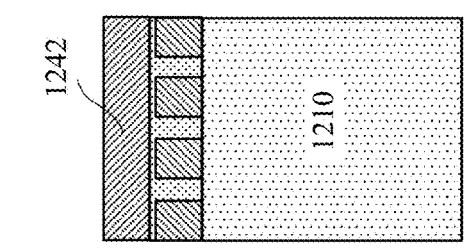
Figure 12I:
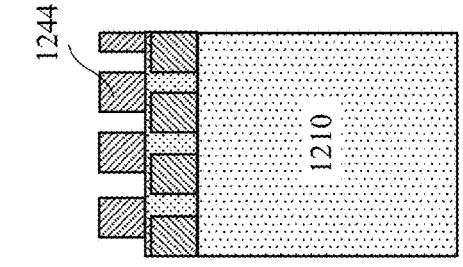
Figure 12J:
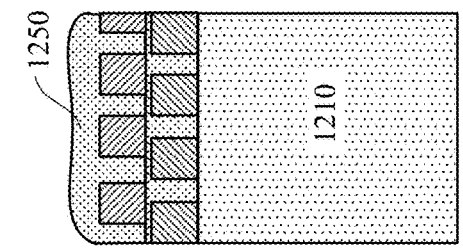
Figure 12K:
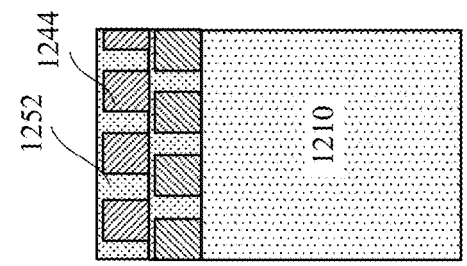

FIG. 12G shows that a high-refractive index material layer 1240 may be deposited on the flat first nanostructure layer. As described above, different deposition techniques may be used to deposit different high-refractive index materials based on their compositions. FIG. 12H shows that the high-refractive index material layer 1240 may be polished or planarized using, for example, CMP techniques, to planarize and thin high-refractive index material layer 1240, such that the remaining portion 1242 of high-refractive index material layer 1240 may be flat and may have the desired thickness for the second nanostructure layer. FIG. 12I shows that the remaining portion 1242 of high-refractive index material layer 1240 may be patterned using various photolithography techniques and various wet or dry etching techniques to form meta-elements 1244 of desired shapes, sizes, and orientations. As shown in FIG. 12I, the segments of the second nanostructure layer may be shifted with respect to the segments of the first nanostructure layer, and thus meta-elements 1244 may be shifted with respect to meta-element 1224. At least one meta-element 1244 may overlap with at least a portion of each meta-element 1224 of two adjacent meta-elements 1224 in the x dimension or the y direction. FIG. 12J shows that a low-index dielectric layer 1250 (e.g., $SiO_2$) may be deposited on meta-elements 1244. Low-index dielectric layer 1250 may fill the gaps between meta-elements 1244 and may also be on top of meta-elements 1244. FIG. 12K shows that low-index dielectric layer 1250 may be polished or planarized to form a flat second nanostructure layer that includes meta-elements 1244 with the low-index dielectric material in regions 1252 between meta-elements 1224. Additional flat nanostructure layers may be fabricated on the flat second nanostructure layer using the processes described above with respect to FIGS. 12G-12K.

Figure 13:
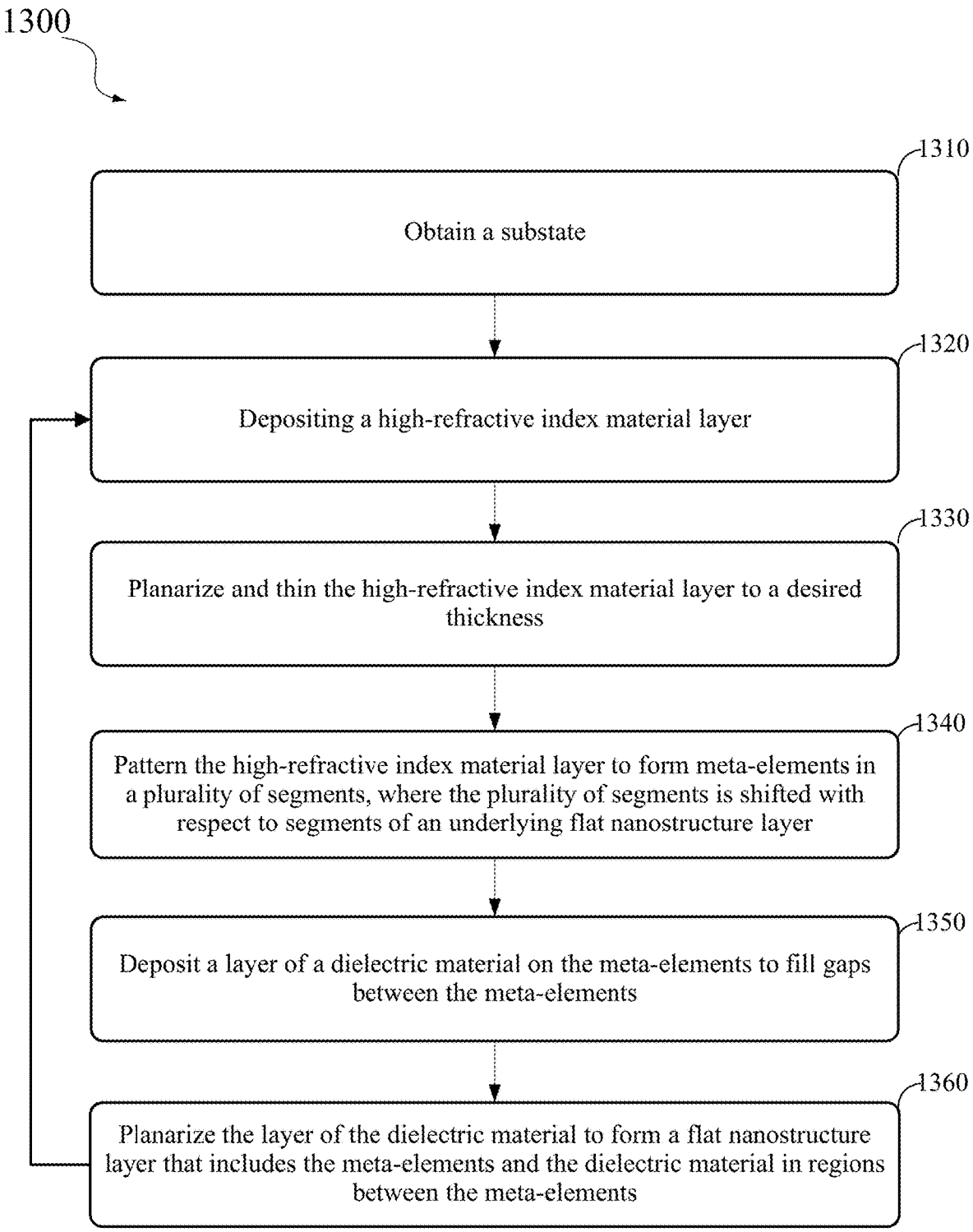
FIG. 13 includes a flowchart illustrating an example of a process of fabricating a flat optical device including multiple layers of nanostructures with shifted segments according to certain embodiments.

FIG. 13 includes a flowchart 1300 illustrating an example of a process of fabricating a flat optical device including multiple layers of nanostructures with shifted segments according to certain embodiments. It is noted that the specific operations illustrated in FIG. 13 provide a particular process of fabricating a flat optical device. Other sequences of operations may be performed according to alternative embodiments. Moreover, the individual operations illustrated in FIG. 13 may include multiple sub-steps that may be performed in various sequences as appropriate to the individual operation. Furthermore, additional operations may be added or some operations may not be performed depending on the particular applications. One of ordinary skill in the art would recognize many variations, modifications, and alternatives.

Operations in block 1310 of flowchart 1300 may include obtaining a substrate, such as a semiconductor wafer, a sapphire wafer, a glass substrate, or a micro-LED wafer with an array of micro-LED formed thereon. The substrate mat include a planarized top surface.

Operations in block 1320 may include depositing a high-refractive index material layer on planarized top surface of the substrate. The high-refractive index material layer may have a refractive index greater than about 2.0, greater than about 2.5, greater than about 2.7, greater than about 3.0, or higher. The high-refractive index material layer may include, for example, $TiO_2$, $ZrO_2$, $HfO_2$, $Ta_2O_5$, $WO_3$, $Nb_2O_5$, GaN, $Si_3N_4$, TiN, ZrN, or HfN, and may be deposited on the substrate using, for example, ALD, MOCVD, or PECVD. The thickness of high-refractive index material layer may be less than a few micrometers or less than a micrometer. Operations in block 1330 may include planarizing and thinning the high-refractive index material layer to a desired thickness using, for example, CMP or etching.

Operations in block 1340 may include patterning the planarized high-refractive index material layer using, for example, photolithography techniques and wet or dry etching techniques, to form meta-elements in a plurality of segments. As described above, a pitch of the plurality of segments may be limited by the patterning techniques, such as the diffraction limit of the photolithography equipment. In some embodiments, the diffraction limit of the photolithography equipment may be greater than about 400 nm or greater than about 500 nm, and thus the pitch of the plurality of segments may be greater than about 400 nm or greater than about 500 nm. When there is at least one underlying flat nanostructure layer, the planarized high-refractive index material layer may be patterned, for example, by shifting the photomask, such that the plurality of segments may be shifted with respect to the segments of the underlying flat nanostructure layer. Shifting the segments of a flat nanostructure layer with respect to segments of another flat nanostructure layer may reduce the effective pitch of the resultant flat optical device that includes two or more flat nanostructure layers.

Operations in block 1350 may include depositing a layer of a dielectric material on the meta-elements to fill gaps between the meta-elements. The dielectric material may have a low refractive index, such as less than about 1.5 or less than about 1.6. In one example, the dielectric material may include $SiO_2$. Operations in block 1360 may include planarizing the layer of the dielectric material using, for example, CMP, to form a flat nanostructure layer that includes the meta-elements and the dielectric material in regions between the meta-elements.

Operations in blocks 1320-1360 may be performed multiple time to form multiple flat nanostructure layers of the flat optical device, where the segments of each flat nanostructure layer may be shifted with respect to the segments of other flat nanostructure layers to reduce the effective pitch of the resultant segments of the flat optical device and improve the resolution of the discretization and the efficiency of the flat optical device as described above with respect to, for example, FIGS. 10B-10E.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 14:
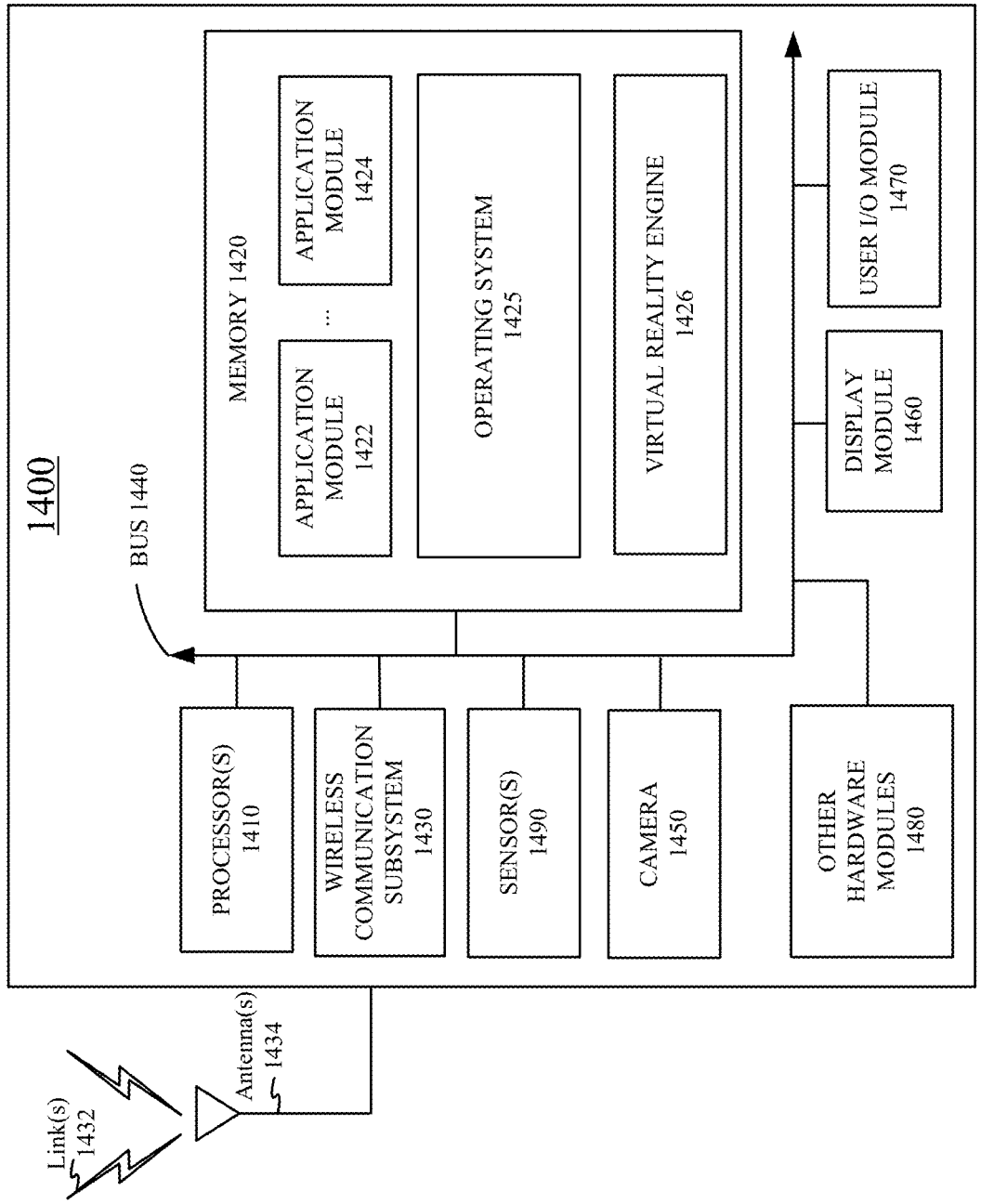
FIG. 14 is a simplified block diagram of an electronic system of an example of a near-eye display according to certain embodiments.

FIG. 14 is a simplified block diagram of an example electronic system 1400 of an example near-eye display (e.g., HMD device) for implementing some of the examples disclosed herein. Electronic system 1400 may be used as the electronic system of an HMD device or other near-eye displays described above. In this example, electronic system 1400 may include one or more processor(s) 1410 and a memory 1420. Processor(s) 1410 may be configured to execute instructions for performing operations at a number of components, and can be, for example, a general-purpose processor or microprocessor suitable for implementation within a portable electronic device. Processor(s) 1410 may be communicatively coupled with a plurality of components within electronic system 1400. To realize this communicative coupling, processor(s) 1410 may communicate with the other illustrated components across a bus 1440. Bus 1440 may be any subsystem adapted to transfer data within electronic system 1400. Bus 1440 may include a plurality of computer buses and additional circuitry to transfer data.

Memory 1420 may be coupled to processor(s) 1410. In some embodiments, memory 1420 may offer both short-term and long-term storage and may be divided into several units. Memory 1420 may be volatile, such as static random access memory (SRAM) and/or dynamic random access memory (DRAM) and/or non-volatile, such as read-only memory (ROM), flash memory, and the like. Furthermore, memory 1420 may include removable storage devices, such as secure digital (SD) cards. Memory 1420 may provide storage of computer-readable instructions, data structures, program modules, and other data for electronic system 1400. In some embodiments, memory 1420 may be distributed into different hardware modules. A set of instructions and/or code might be stored on memory 1420. The instructions might take the form of executable code that may be executable by electronic system 1400, and/or might take the form of source and/or installable code, which, upon compilation and/or installation on electronic system 1400 (e.g., using any of a variety of generally available compilers, installation programs, compression/decompression utilities, etc.), may take the form of executable code.

In some embodiments, memory 1420 may store a plurality of application modules 1422 through 1424, which may include any number of applications. Examples of applications may include gaming applications, conferencing applications, video playback applications, or other suitable applications. The applications may include a depth sensing function or eye tracking function. Application modules 1422-1424 may include particular instructions to be executed by processor(s) 1410. In some embodiments, certain applications or parts of application modules 1422-1424 may be executable by other hardware modules 1480. In certain embodiments, memory 1420 may additionally include secure memory, which may include additional security controls to prevent copying or other unauthorized access to secure information.

In some embodiments, memory 1420 may include an operating system 1425 loaded therein. Operating system 1425 may be operable to initiate the execution of the instructions provided by application modules 1422-1424 and/or manage other hardware modules 1480 as well as interfaces with a wireless communication subsystem 1430 which may include one or more wireless transceivers. Operating system 1425 may be adapted to perform other operations across the components of electronic system 1400 including threading, resource management, data storage control and other similar functionality.

Wireless communication subsystem 1430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1400 may include one or more antennas 1434 for wireless communication as part of wireless communication subsystem 1430 or as a separate component coupled to any portion of the system. Depending on desired functionality, wireless communication subsystem 1430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1430 may permit data to be exchanged with a network, other computer systems, and/or any other devices described herein. Wireless communication subsystem 1430 may include a means for transmitting or receiving data, such as identifiers of HMD devices, position data, a geographic map, a heat map, photos, or videos, using antenna(s) 1434 and wireless link(s) 1432. Wireless communication subsystem 1430, processor(s) 1410, and memory 1420 may together comprise at least a part of one or more of a means for performing some functions disclosed herein.

Embodiments of electronic system 1400 may also include one or more sensors 1490. Sensor(s) 1490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1490 may include one or more IMUs and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1400 may include a display module 1460. Display module 1460 may be a near-eye display, and may graphically present information, such as images, videos, and various instructions, from electronic system 1400 to a user. Such information may be derived from one or more application modules 1422-1424, virtual reality engine 1426, one or more other hardware modules 1480, a combination thereof, or any other suitable means for resolving graphical content for the user (e.g., by operating system 1425). Display module 1460 may use LCD technology, LED technology (including, for example, OLED, ILED, µ-LED, AMOLED, TOLED, etc.), light emitting polymer display (LPD) technology, or some other display technology.

Electronic system 1400 may include a user input/output module 1470. User input/output module 1470 may allow a user to send action requests to electronic system 1400. An action request may be a request to perform a particular action. For example, an action request may be to start or end an application or to perform a particular action within the application. User input/output module 1470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1400. In some embodiments, user input/output module 1470 may provide haptic feedback to the user in accordance with instructions received from electronic system 1400. For example, the haptic feedback may be provided when an action request is received or has been performed.

Electronic system 1400 may include a camera 1450 that may be used to take photos or videos of a user, for example, for tracking the user's eye position. Camera 1450 may also be used to take photos or videos of the environment, for example, for VR, AR, or MR applications. Camera 1450 may include, for example, a CMOS image sensor with a few millions or tens of millions of pixels. In some implementations, camera 1450 may include two or more cameras that may be used to capture 3-D images.

In some embodiments, electronic system 1400 may include a plurality of other hardware modules 1480. Each of other hardware modules 1480 may be a physical module within electronic system 1400. While each of other hardware modules 1480 may be permanently configured as a structure, some of other hardware modules 1480 may be temporarily configured to perform specific functions or temporarily activated. Examples of other hardware modules 1480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1480 may be implemented in software.

In some embodiments, memory 1420 of electronic system 1400 may also store a virtual reality engine 1426. Virtual reality engine 1426 may execute applications within electronic system 1400 and receive position information, acceleration information, velocity information, predicted future positions, or any combination thereof of the HMD device from the various sensors. In some embodiments, the information received by virtual reality engine 1426 may be used for producing a signal (e.g., display instructions) to display module 1460. For example, if the received information indicates that the user has looked to the left, virtual reality engine 1426 may generate content for the HMD device that mirrors the user's movement in a virtual environment. Additionally, virtual reality engine 1426 may perform an action within an application in response to an action request received from user input/output module 1470 and provide feedback to the user. The provided feedback may be visual, audible, or haptic feedback. In some implementations, processor(s) 1410 may include one or more GPUs that may execute virtual reality engine 1426.

In various implementations, the above-described hardware and modules may be implemented on a single device or on multiple devices that can communicate with one another using wired or wireless connections. For example, in some implementations, some components or modules, such as GPUs, virtual reality engine 1426, and applications (e.g., tracking application), may be implemented on a console separate from the head-mounted display device. In some implementations, one console may be connected to or support more than one HMD.

In alternative configurations, different and/or additional components may be included in electronic system 1400. Similarly, functionality of one or more of the components can be distributed among the components in a manner different from the manner described above. For example, in some embodiments, electronic system 1400 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A flat optical device comprising:
a substrate;
a first nanostructure layer on the substrate, the first nanostructure layer including a first array of meta-elements in a first array of segments, wherein each meta-element of the first array of meta-elements is characterized by a first height in a first direction; and
a second nanostructure layer on the first nanostructure layer, the second nanostructure layer including a second array of meta-elements in a second array of segments, wherein each meta-element of the second array of meta-elements is characterized by a second height in the first direction, wherein the second array of segments is shifted with respect to the first array of segments by a value in one or more directions perpendicular to the first direction, the value being greater than zero and less than a pitch of the first array of segments, and wherein: a pitch of the array of micro-LEDs is equal to or less than 10 µm; the pitch of the first array of segments is equal to or greater than 400 nm; and a pitch of the second array of segments is equal to or greater than 400 nm.

2. The flat optical device of claim 1, wherein a meta-element of the second array of meta-elements overlaps with at least a portion of each meta-element of two adjacent meta-elements of the first array of meta-elements in at least one direction perpendicular to the first direction.

3. The flat optical device of claim 1, wherein: the pitch of the first array of segments is equal to or greater than 400 nm; and a pitch of the second array of segments is equal to or greater than 400 nm.

4. The flat optical device of claim 1, wherein an offset between the first array of segments and the second array of segments in a second direction perpendicular to the first direction is equal to or less than a half of the pitch of the first array of segments in the second direction.

5. The flat optical device of claim 1, wherein the second array of segments is shifted with respect to the first array of segments in two different directions perpendicular to the first direction.

6. The flat optical device of claim 1, wherein the second height is the same as or different from the first height.

7. The flat optical device of claim 1, wherein the first nanostructure layer includes a dielectric material between the first array of meta-elements, the dielectric material having a refractive index lower than a refractive index of the first array of meta-elements.

8. The flat optical device of claim 1, wherein the first array of meta-elements and the second array of meta-elements include $TiO_2$, $ZrO_2$, $HfO_2$, $Ta_2O_5$, $WO_3$, $Nb_2O_5$, GaN, $Si_3N_4$, TiN, ZrN, HfN, or a combination.

9. The flat optical device of claim 1, wherein the first array of meta-elements and the second array of meta-elements are characterized by a refractive index greater than 2.5.

10. The flat optical device of claim 1, further comprising a third nanostructure layer on the second nanostructure layer, wherein: the third nanostructure layer includes a third array of meta-elements in a third array of segments; each meta-element of the third array of meta-elements is characterized by a third height in the first direction; and the third array of segments is shifted with respect to the first array of segments and the second array of segments in one or more directions perpendicular to the first direction.

11. The flat optical device of claim 10, wherein the third height is the same as or different from the first height and the second height.

12. The flat optical device of claim 1, wherein the first array of segments includes a two-dimensional array of rectangles or a two-dimensional array of hexagons.

13. A light source comprising:
an array of micro-light emitting diodes (micro-LEDs); and
an array of flat micro-lenses on the array of micro-LEDs, the array of flat micro-lenses comprising:
a first flat nanostructure layer including a first array of meta-elements in a first array of segments; and
a second flat nanostructure layer on the first flat nanostructure layer and including a second array of meta-elements in a second array of segments, wherein the second array of segments is shifted with respect to the first array of segments by a value in one or more directions perpendicular to a thickness direction of the first flat nanostructure layer, the value being greater than zero and less than a pitch of the first array of segments, wherein a thickness of the second flat nanostructure layer is the same as or different from a thickness of the first flat nanostructure layer, and wherein: a pitch of the array of micro-LEDs is equal to or less than 10 µm; the pitch of the first array of segments is equal to or greater than 400 nm; and a pitch of the second array of segments is equal to or greater than 400 nm.

14. The light source of claim 13, wherein a meta-element of the second array of meta-elements overlaps with at least a portion of each meta-element of two adjacent meta-elements of the first array of meta-elements in at least one direction perpendicular to the thickness direction of the first flat nanostructure layer.

15. The light source of claim 13, wherein a pitch of the array of flat microlenses is the same as or different from a pitch of the array of micro-LEDs.

16. The light source of claim 13, wherein an offset between the first array of segments and the second array of segments in a first direction perpendicular to the thickness direction of the first flat nanostructure layer is equal to or less than a half of the pitch of the first array of segments in the first direction.

17. The light source of claim 13, wherein the second array of segments is shifted with respect to the first array of segments in two different directions perpendicular to the thickness direction of the first flat nanostructure layer.

18. The light source of claim 13, wherein the first array of meta-elements and the second array of meta-elements are characterized by a refractive index greater than 2.0.

19. The light source of claim 13, wherein:
the array of flat micro-lenses further comprises a third flat nanostructure layer on the second flat nanostructure layer;
the third flat nanostructure layer includes a third array of meta-elements in a third array of segments; and
the third array of segments is shifted with respect to the first array of segments and the second array of segments in one or more directions perpendicular to the thickness direction of the first flat nanostructure layer.

* * * * *